(12) United States Patent
Chen

(10) Patent No.: US 11,089,274 B2
(45) Date of Patent: Aug. 10, 2021

(54) LIGHT SOURCE DEVICE AND PROJECTION APPARATUS

(71) Applicant: Coretronic Corporation, Hsin-Chu (TW)

(72) Inventor: Chang-Hsuan Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/746,995

(22) Filed: Jan. 20, 2020

(65) Prior Publication Data

US 2020/0241404 A1 Jul. 30, 2020

(30) Foreign Application Priority Data

Jan. 29, 2019 (CN) .......................... 201910086104.1

(51) Int. Cl.
*H04N 9/31* (2006.01)
*G03B 21/20* (2006.01)
*H01S 5/00* (2006.01)

(52) U.S. Cl.
CPC ......... *H04N 9/3161* (2013.01); *G03B 21/204* (2013.01); *G03B 21/2013* (2013.01); *H01S 5/005* (2013.01)

(58) Field of Classification Search
CPC ................... H04N 9/31–3197; G03B 21/00–64
See application file for complete search history.

(56) References Cited

U.S. PATENT DOCUMENTS

| 5,838,247 | A | 11/1998 | Bladowski | |
|---|---|---|---|---|
| 2010/0072900 | A1* | 3/2010 | Deppe | G03B 21/2053 315/151 |
| 2012/0320355 | A1* | 12/2012 | Maeda | G03B 21/2066 355/67 |
| 2013/0100974 | A1* | 4/2013 | Janssens | G02B 27/0961 372/35 |
| 2015/0181179 | A1* | 6/2015 | Yamamoto | G02B 19/0057 348/748 |

(Continued)

FOREIGN PATENT DOCUMENTS

| CN | 102722077 A | 10/2012 |
|---|---|---|
| CN | 102841494 A | 12/2012 |

(Continued)

*Primary Examiner* — Michelle M Iacoletti
*Assistant Examiner* — Christopher A Lamb, II

(57) ABSTRACT

A light source device has light source module. The light source module has a light source assembly having a plurality of light source combinations. The light source combinations are arranged around a central axis. Each of the light source combinations has an excitation light source and a reflecting article. The reflecting article is disposed between the excitation light source and the central axis for reflecting an excitation light of the excitation light source to form an illumination beam. A type of the excitation light sources of the light source module is composed of a red excitation source, a green excitation source, and a blue excitation source. A projection apparatus has the light source device, a light valve, and a projection lens. The light source device and the projection apparatus have advantages of improving the utilization efficiency of condenser lens, simple configuration, low cost, and wide color gamut.

20 Claims, 14 Drawing Sheets

(56) References Cited

U.S. PATENT DOCUMENTS

2015/0323861 A1* 11/2015 Saitou .................. G03B 21/204
                                                           353/31
2016/0091785 A1    3/2016 Inoko et al.
2016/0363273 A1   12/2016 Piehler et al.

FOREIGN PATENT DOCUMENTS

| CN | 103176340 A | 6/2013 |
| CN | 103322471 A | 9/2013 |
| CN | 105467736 A | 4/2016 |
| CN | 106249527 A | 12/2016 |
| CN | 207541400 U | 6/2018 |
| CN | 209525552 U | 10/2019 |
| EP | 1826474 A1 | 8/2007 |
| JP | 2003347595 A | 12/2003 |
| TW | 200916824 A | 4/2009 |
| TW | I451130 B | 9/2014 |

* cited by examiner

LIGHT SOURCE DEVICE AND PROJECTION APPARATUS

CROSS-REFERENCE TO RELATED APPLICATION

This application claims the priority benefit of CN201910086104.1, filed on 2019 Jan. 29. The entirety of the above-mentioned patent application is hereby incorporated by reference herein and made a part of this specification.

FIELD OF THE INVENTION

The invention relates to a light source device and a projection apparatus.

BACKGROUND OF THE INVENTION

A laser projection apparatus has a projection lens, an optical engine, and a light source device. The light source device is in charge of light-condensing, spectrum conversion, real-time color segmentation. The optical engine is in charge of color light filtering, color light homogenizing, and grayscale generating. The projection lens is in charge of image projection. To improve the efficiency in light collecting, the laser lights are condensed into a small light spot. Before light condensing, the laser sources are arranged in an array on a plane, and then the laser lights are mixed by a light combiner, so as to achieve the laser light collecting effect. However, the laser lights of the arranged laser sources pass through the light combiner and form light spot pattern on a condenser lens. The light spot pattern is mainly distributed on the center portion of the condenser lens. The peripheral portion of the condenser lens is mostly unused. Therefore, the condenser lens of the light source device is not efficiently utilized.

In addition, the conventional light combiners applied for mixing red, green, and blue lasers are consisted of laser fibers, the configuration of the light combiners is complicated and is costly, and thereby resulting in a high price for a projection apparatus with a light source of red, green, and blue lasers. Further, a conventional projection apparatus with a light source of red, green, and blue light-emitting diodes (LEDs) is relatively cheap in price, but the color gamut of the projection apparatus can only meet the REC.709 standard of International Telecommunication Union (ITU). It is much lower than the REC. 2020 standard that a projection apparatus with a light source of red, green, and blue lasers can meet. In other words, the color gamut of the projection apparatus with the light source of red, green, and blue LEDs is narrower than the projection apparatus with the light source of red, green, and blue lasers.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a light source device and a projection apparatus, which have advantages of improving the utilization efficiency of condenser lens, simple configuration, low cost, and wide color gamut.

Other advantages and objects of the invention may be further illustrated by the technical features broadly embodied and described as follows.

In order to achieve one or a portion of or all of the objects or other objects, an embodiment of the invention provides a light source device. The light source device includes a light source module including a light source assembly. The light source assembly includes a plurality of light source combinations. The light source combinations are arranged around a central axis. Each of the light source combinations includes an excitation light source and a reflecting article. The reflecting article is disposed between the central axis and the excitation light source for reflecting an excitation light of the excitation light source to form an illumination beam. A type of the excitation light sources included in the light source module is consisted of a red excitation source, a green excitation source, and a blue excitation source.

In order to achieve one or a portion of or all of the objects or other objects, an embodiment of the invention provides a light source device. The light source device includes a first light source module, a first condenser lens, a first beam splitter, and a second light source module. The first light source module includes a first light source assembly. The first light source assembly includes a plurality of first light source combinations. The first light source combinations are arranged around a first central axis. Each of the first light source combinations includes a first excitation light source and a first reflecting article. The first reflecting article is disposed between the first excitation light source and the first central axis for reflecting a first excitation light of the first excitation light source. The first beam splitter is disposed between the first light source module and the first condenser lens. The second light source module is disposed at a side of the first beam splitter distal away from the first light source module and includes a second light source assembly. The second light source assembly includes a plurality of second light source combinations. The second light source combinations are arranged around a second central axis. Each of the second light source combinations includes a second excitation light source and a second reflecting article. The second reflecting article is disposed between the second excitation light source and the second central axis for reflecting a second excitation light of the second excitation light source. The first reflecting articles of the first light source combinations of the first light source assembly reflect the first excitation lights and a plurality of first reflected lights are formed. The second reflecting articles of the second light source combinations of the second light source assembly reflect the second excitation lights and a plurality of second reflected lights are formed. The first beam splitter is configured to transmit the first reflected lights, and reflect the second reflected lights. The first condenser lens is configured to converge the first reflected lights and the second reflected lights after the first reflected lights and the second reflected lights pass the first beam splitter into a first concentrating light, so as to form an illumination beam. A type of the first excitation light sources included in the first light source module and a type the second excitation light sources included in the second light source module are consisted of a red excitation source, a green excitation source, and a blue excitation source.

In order to achieve one or a portion of or all of the objects or other objects, an embodiment of the invention provides a projection apparatus. The projection apparatus includes a light source device, a light valve, and a projection lens. The light source device is configured to provide an illumination beam. The light valve is disposed on a transmission path of the illumination beam to form an image beam. The projection lens is disposed on a transmission path of the image beam. The light source device includes a light source module. The light source module includes a light source assembly. The light source assembly includes a plurality of light source combinations. The light source combinations are arranged around a central axis. Each of the light source combinations includes an excitation light source and a reflecting article. The reflecting article is disposed between the excitation light source and the central axis for reflecting an excitation light of the excitation light source to form the illumination beam. A type of the excitation light sources included in the light source module is consisted of a red excitation source, a green excitation source, and a blue excitation source.

In the light source device and the projection apparatus of the invention, since the light source combinations of the light source assembly are arranged around the central axis, and the reflecting article is disposed between the excitation light source and the central axis, the reflecting lights formed by reflecting the excitation lights of the excitation light sources of the light source assembly by the reflecting articles may form circularly-distributed light spot pattern on a peripheral portion of the first condenser lens. Therefore, the peripheral portion of the condenser lens is utilized, and utilization efficiency of the first condenser lens is improved. In addition, since the mixing of the excitation lights of the excitation light source of the light source combinations is achieved by the cooperation of the reflecting articles of the light source combinations and the first condenser lens, the configuration is simple and the cost is low. Further, since the type of the excitation light sources included in the light source module is consisted of the red excitation source, the green excitation source, and the blue excitation source, the color gamut of the light source device and the projection apparatus may reach REC. 2020 standard. Accordingly, the light source device and the projection apparatus have advantages of improving the utilization efficiency of condenser lens, simple configuration, low cost, and wide color gamut.

Other objectives, features and advantages of the invention will be further understood from the further technological features disclosed by the embodiments of The invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
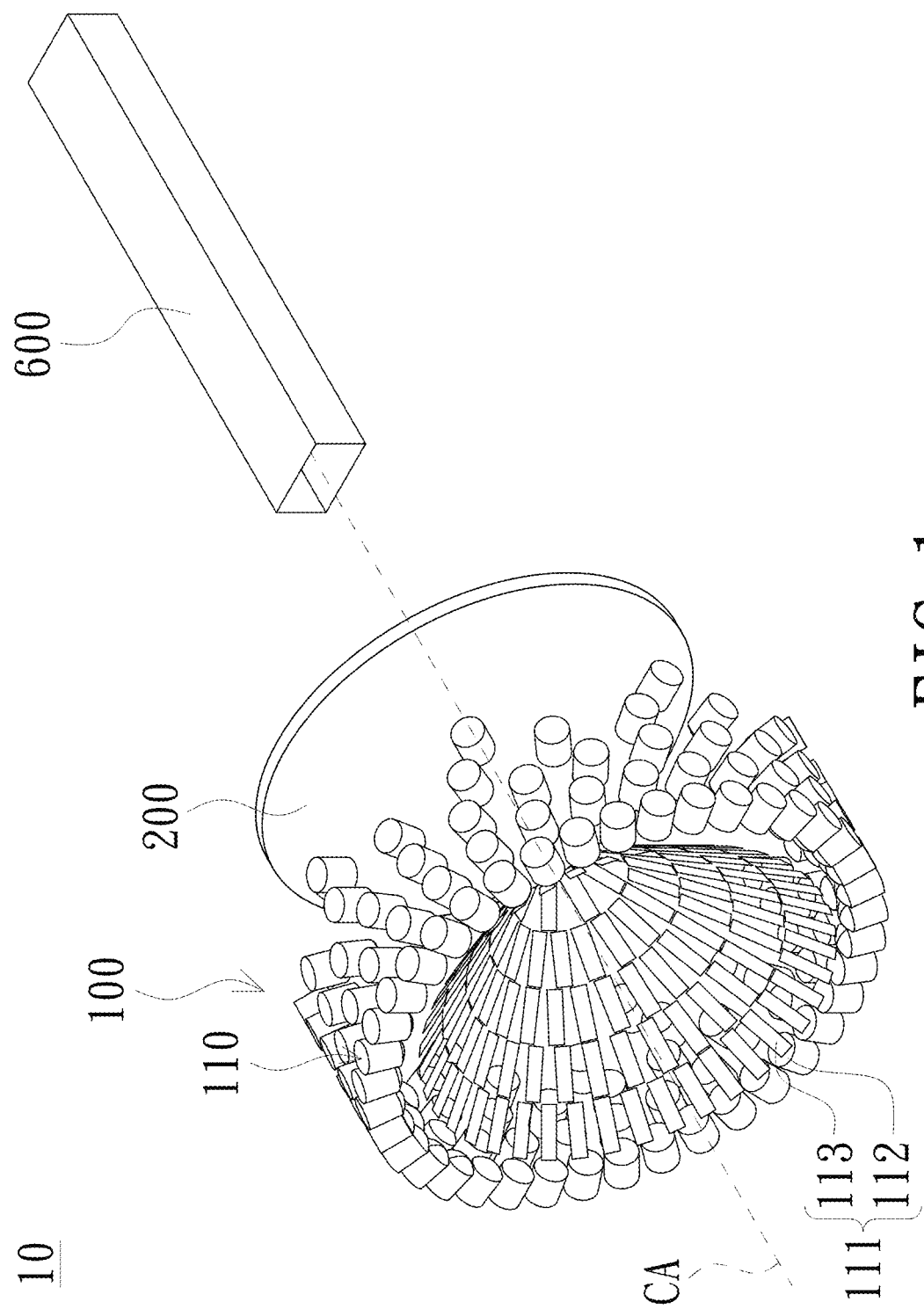
FIG. 1 is a schematic diagram of a light source device according to an embodiment of the invention.
Figure 2:
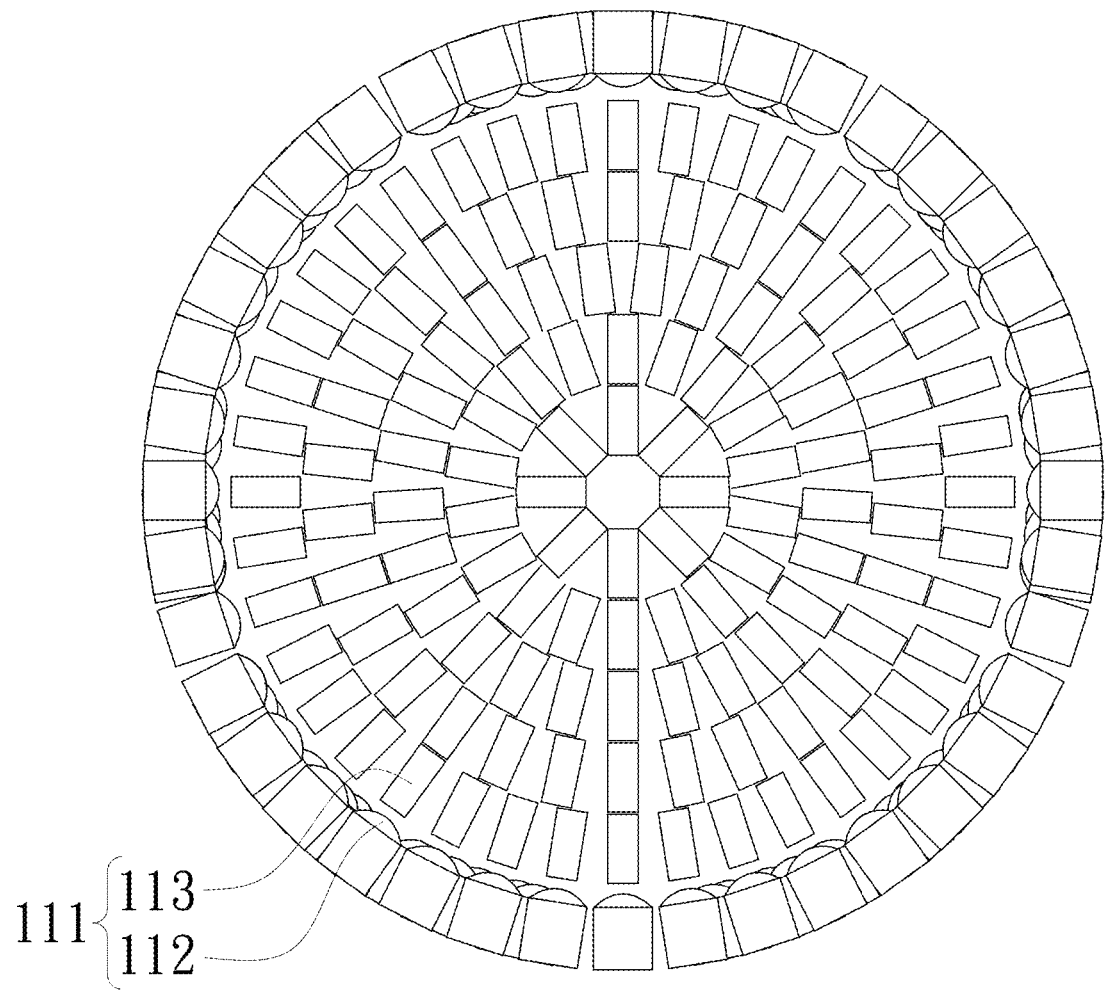
FIG. 2 is a front view of FIG. 1.
Figure 3:
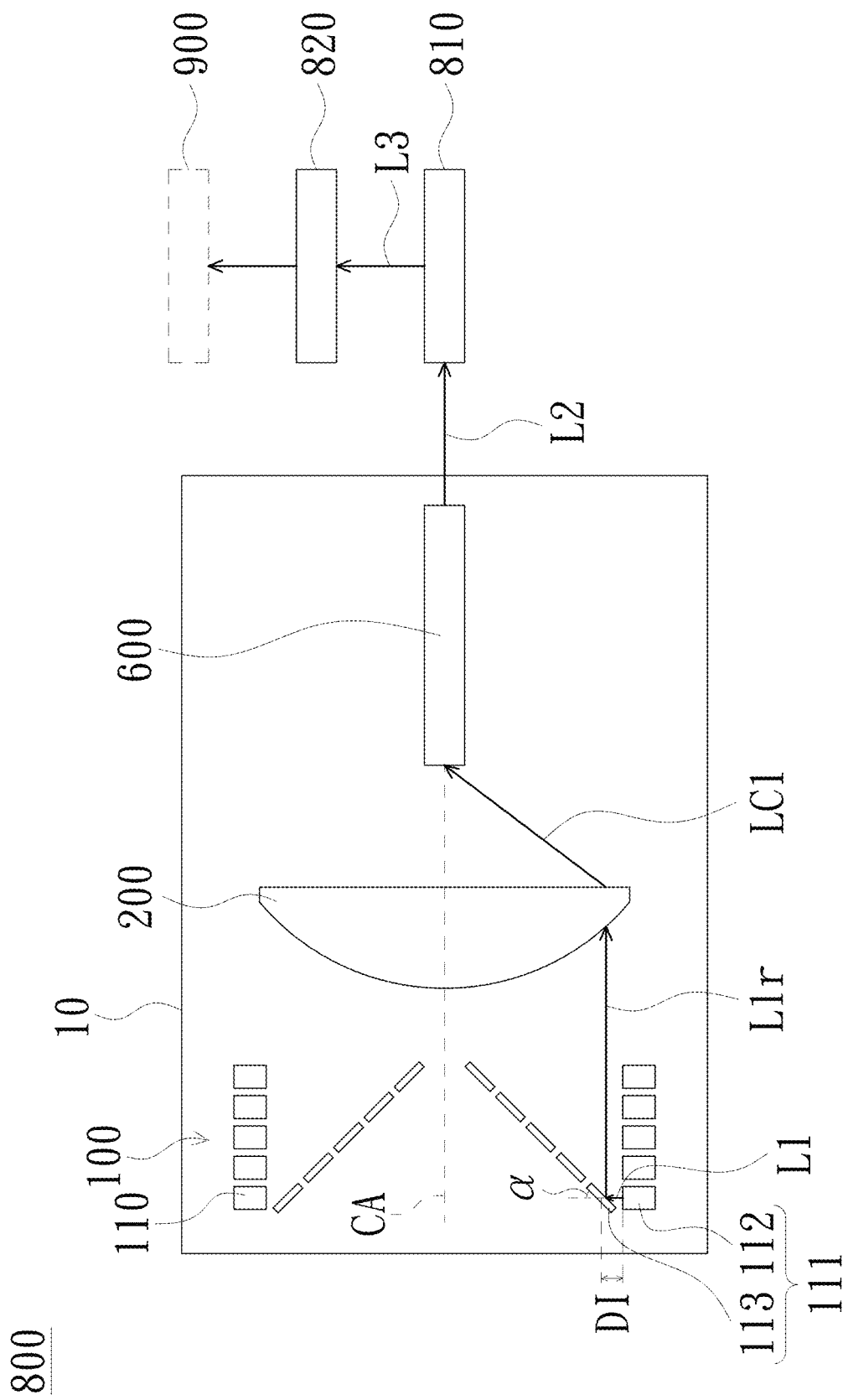
FIG. 3 is a schematic diagram of a projection apparatus having the light source device shown in FIG. 1 according to an embodiment of the invention.
Figure 4:
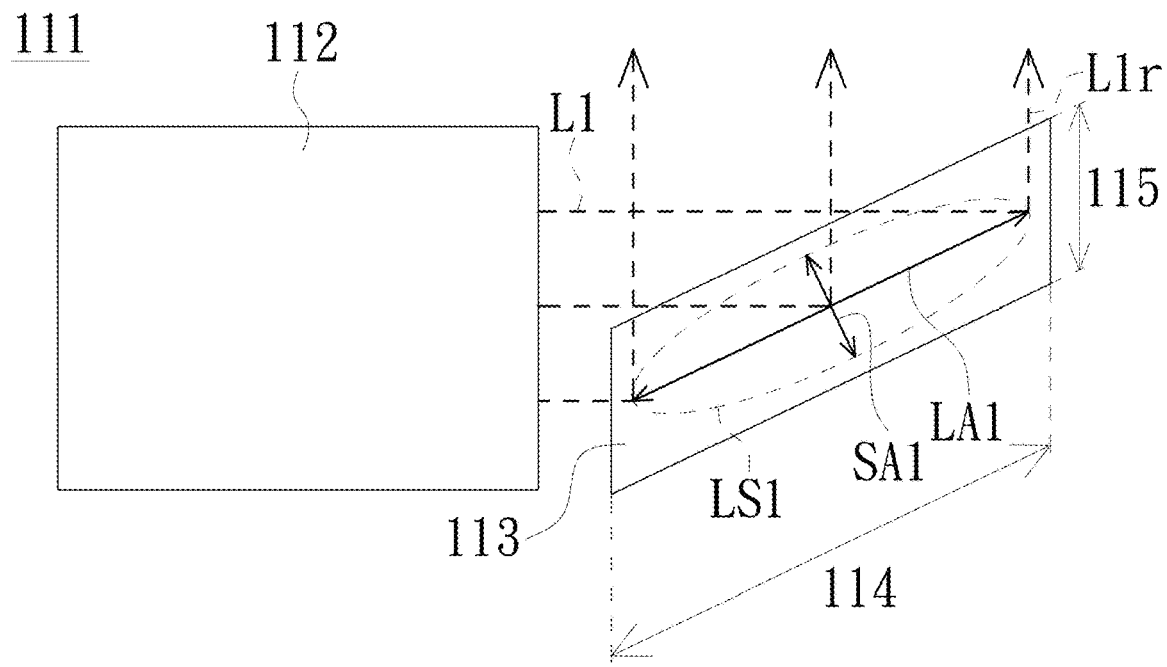
FIG. 4 is a schematic diagram of a light source combination of the light source device shown in FIG. 1.

FIG. 1 is a schematic diagram of a light source device according to an embodiment of the invention. FIG. 2 is a front view of FIG. 1. FIG. 3 is a schematic diagram of a projection apparatus having the light source device shown in FIG. 1 according to an embodiment of the invention. FIG. 4 is a schematic diagram of a light source combination of the light source device shown in FIG. 1. Referring to FIGS. 1 to 4, the light source device 10 of the embodiment includes one light source module 100. The light source module 100 includes a light source assembly 110. The light source assembly 110 includes a plurality of light source combinations 111 arranged around a central axis CA. Each of the light source combinations 111 includes an excitation light source 112 and a reflecting article 113. The excitation light source 112 is configured to emit an excitation light (laser light) L1. The reflecting article 113 is disposed between the excitation light source 112 and the central axis CA for reflecting the excitation light (laser light) L1 coming from the excitation light source 112 to form an illumination beam L2. A type of the excitation light sources 112 included in the light source module 100 is consisted of a red excitation light source (red laser source), a green excitation light source (green laser source), and a blue excitation light source (blue laser source). In addition, further, as shown in FIG. 1, one light source assembly 110 is the light source combinations 111 arranged in a whole circle around the central axis CA. A number of the light source assembly 110 (a number of circle) included in the light source module 100 may be one or more than one, and a number of the excitation light source 112 may be one or more than one. In the embodiment, the number of the light source assembly 110 is five; that is, the light source module 100 of the embodiment includes light source combinations 111 are arranged in five circles around the central axis CA. The number of the excitation light sources 112 of each of the light source combinations 111 is one, and the number of the reflecting article 113 of each of the light source combinations 111 is one, but the invention is not limited thereto.

In addition, in the embodiment, the type of the excitation light sources 112 included in each of the light source assemblies 110 may be consisted of the red laser source, be consisted of the green laser source, or be consisted of the blue laser source; that is, each of the light source assemblies 110 only has the red laser source, the green laser source, or the blue laser source. In other words, kinds of the excitation light sources 112 in the same circle around the central axis CA are the same. For example, the types of the excitation light sources 112 of the five light source assemblies 110 may sequentially be: the red laser source for the first circle, the green laser source for the second circle, the blue laser source for the third circle, the red laser source for the fourth circle, and the green laser source for the fifth circle, but the invention is not limited thereto. In some embodiments, the type of the excitation light sources 112 included in each of the light source assemblies 110 may be consisted of the red laser source, the green laser source, and the blue laser source; that is, each of the light source assemblies 110 has the red laser source, the green laser source, and the blue laser source. In other words, kinds of the excitation light sources 112 in the same circle around the central axis CA may include the red laser source, the green laser source, and the blue laser source. In other embodiments, the type of the excitation light sources 112 included in each of the light source assemblies 110 may be consisted of two of the red laser source, the green laser source, and the blue laser source; that is, each of the light source assemblies 110 has two of the red laser source, the green laser source, and the blue laser source. In other words, kinds of the excitation light sources 112 in the same circle around the central axis CA may include two of the red laser source, the green laser source, and the blue laser source. In still other embodiments, for three of the five light source assemblies 110, the type of the excitation light sources 112 included in each of the light source assemblies 110 may be consisted of the red laser source, be consisted of the green laser source, or be consisted of the blue laser source; for the rest two of the five light source assemblies 110, the type of the excitation light sources 112 included in each of the light source assemblies 110 may be consisted of two of the red laser source, the green laser source, and the blue laser source. In other words, the distribution and arrangement of the excitation light sources 112 included in the light source module 100 are not limited in the invention, as long as the red laser source, the green laser source, and the blue laser source are included in the light source assemblies 110 of the light source module 100.

In each of the light source combinations 111, an angle α between the reflecting article 113 and a transmission direction of the laser light L1 of the excitation light source 112 may be 45°, and the central axis CA may be parallel with a transmission direction of the illumination beam L2, as shown in FIG. 3. In addition, the reflecting article 113 may have a long axis 114 and a short axis 115 intersecting with the long axis 114. The laser light L1 forms a light spot LS1 on the reflecting article 113. The light spot LS1 has a light spot long axis LA1 and a light spot short axis SA1 intersecting with the light spot long axis LS1. The light spot long axis LA1 may be parallel with the long axis 114 of the reflecting article 113, and the light spot short axis SA1 may be parallel with the shot axis 115 of the reflecting article 113, as shown in FIG. 4. Further, the light source combinations 111 of each of the light source assemblies 110 may be arranged around the central axis CA at the same distance (the pitch of the light source combinations 111); for example, the excitation light sources 112 of the light source combinations 111 of the five light source assemblies 110 may be arranged around the central axis CA at the same distance (the pitch of the excitation light sources 112), and the reflecting article 113 are planar reflecting articles arranged individually. In the embodiment, the light spot LS1 formed by the laser light L1 on the reflecting article 113 may be an oval, and the shape of the reflecting article 113 is rectangle. By arranging the light source combinations 111 of each of the light source assemblies 110 around the central axis CA and the shape of the reflecting article 113 corresponding to the light spot LS1, the overall volume of the light source device 10 may be decreased, but the invention is not limited thereto. In other embodiments, the shape of the reflecting article 113 may be a geometric shape, such as a square, a trapezoid, a triangle, and a circle, or a non-geometric shape.

The light source device 10 may further include a first condenser lens 200, and the first condenser lens 200 is disposed on the central axis CA, as shown in FIGS. 1 and 3. The reflecting article 113 of each of the light source combinations 111 of the light source assemblies 110 in the light source module 100 reflects the laser light L1 from the excitation light source 111 and a reflected light L1r is formed, so the light source assemblies 110 in the light source module 100 forms a plurality of reflected lights L1r. Transmission directions of the reflected lights L1r are parallel with the central axis CA. The first condenser lens 200 is configured to converge the reflected lights L1r into a first concentrating light LC1, so as to form the illumination beam L2, as shown in FIG. 3. In addition, the light source device 10 may further include a light homogenizing component 600. The light homogenizing component 600 may be an integral rod. The first concentrating light LC1 directly enters and passes through the light homogenizing component 600 to form the illumination beam L2.

Figure 5:
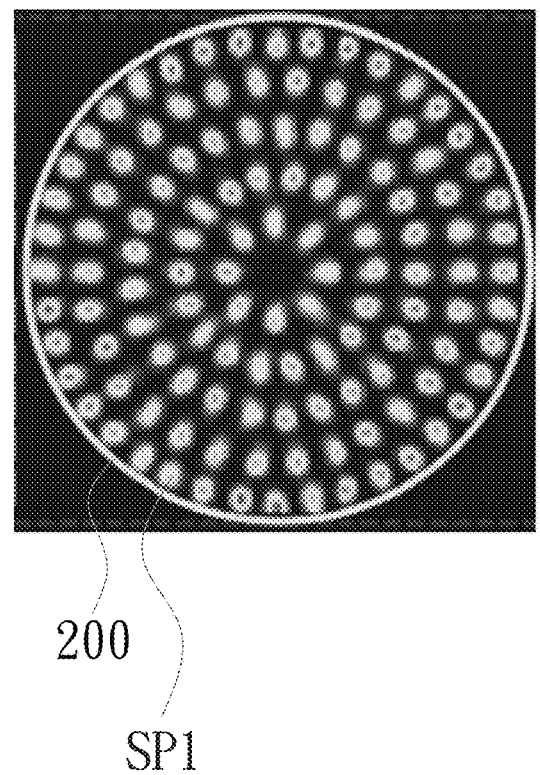
FIG. 5 is a simulation diagram of light spot pattern formed by illuminations of reflected lights in FIG. 3 on a first condenser lens.

In the light source device 10 of the embodiment, since the light source combinations 111 of each of the light source assemblies 110 are arranged around the central axis CA, and the reflecting article 113 is disposed between the excitation light source 112 and the central axis CA, the arrangement density of the excitation light sources 112 and the reflecting articles 113 may be increase, and thereby lowering the overall volume of the light source device 10. In addition, FIG. 5 is a simulation diagram of light spot pattern SP1 formed by illuminations of reflected lights L1r in FIG. 3 on the first condenser lens 200. Referring to FIGS. 3 and 5, the reflected lights L1r are formed after the laser lights L1 of the excitation light sources 112 of each of the light source assemblies 110 are reflected by the corresponding reflecting articles 113, and the reflected lights L1r form light spot pattern SP1 on a surface of the condenser lens 200 facing the light source assemblies 110. The light spots of light spot pattern SP1 are circularly distributed. The light spot pattern SP1 may be distributed from the center portion of the condenser lens 200 to the peripheral portion of the condenser lens 200; in this way, the peripheral portion of the condenser lens 200 may be utilized, and the utilization efficiency of the condenser lens 200 is improved. Further, by improving the utilization efficiency of the condenser lens 200, the light intensity of the first concentrating light LC1 can be increased, and thereby increasing the light intensity of the illumination beam L2.

In addition, in the embodiment, the number of the light source assembly 110 is more than one, for example, the five light source assemblies 110 mentioned above. The light source assemblies 110 may be sequentially arranged along the central axis CA toward the transmission direction of the illumination beam L2, and a distance DI is formed between the reflecting article 113 and the excitation light source 112 in each of the light source combinations 111 of each of the light source assemblies 110. The distance DI of the light source assemblies 110 may increase along the central axis CA toward the transmission direction of the illumination beam L2; that is, the distance DI between the reflecting article 113 and the excitation light source 112 in each of the light source combinations 111 of the light source assembly 110 closest to the first condenser lens 200 is larger than the distance DI between the reflecting article 113 and the excitation light source 112 in each of the light source combinations 111 of the adjacent light source assembly 110. Accordingly, a plurality of concentric speckle rings may be formed on the first condenser lens 200 by the light source assemblies 110, and the concentric speckle rings are sequentially arranged on the first condenser lens 200 from the peripheral portion of the first condenser lens 200 to the center portion of the first condenser lens 200, and thus, the first condenser lens 200 is fully-utilized, and the light intensity of the illumination beam L2 is further increased.

Further, in the light source device 10 of the embodiment, the mixing of the laser lights L1 of the excitation light source 112 of the light source combinations 111 is achieved by the cooperation of the reflecting articles 113 of the light source combinations 111 and the first condenser lens 200, so the configuration used in the embodiment for light combining is relatively simple and is low-cost. In addition, since the type of the excitation light sources 112 included in the light source module 100 is consisted of the red laser source, the green laser source, and the blue laser source; that is, the light sources used in the light source device 10 of the embodiment for generating the illumination beam L2 is the red laser source, the green laser source, and the blue laser source; the color gamut of the light source device may reach REC. 2020 standard.

Figure 6:
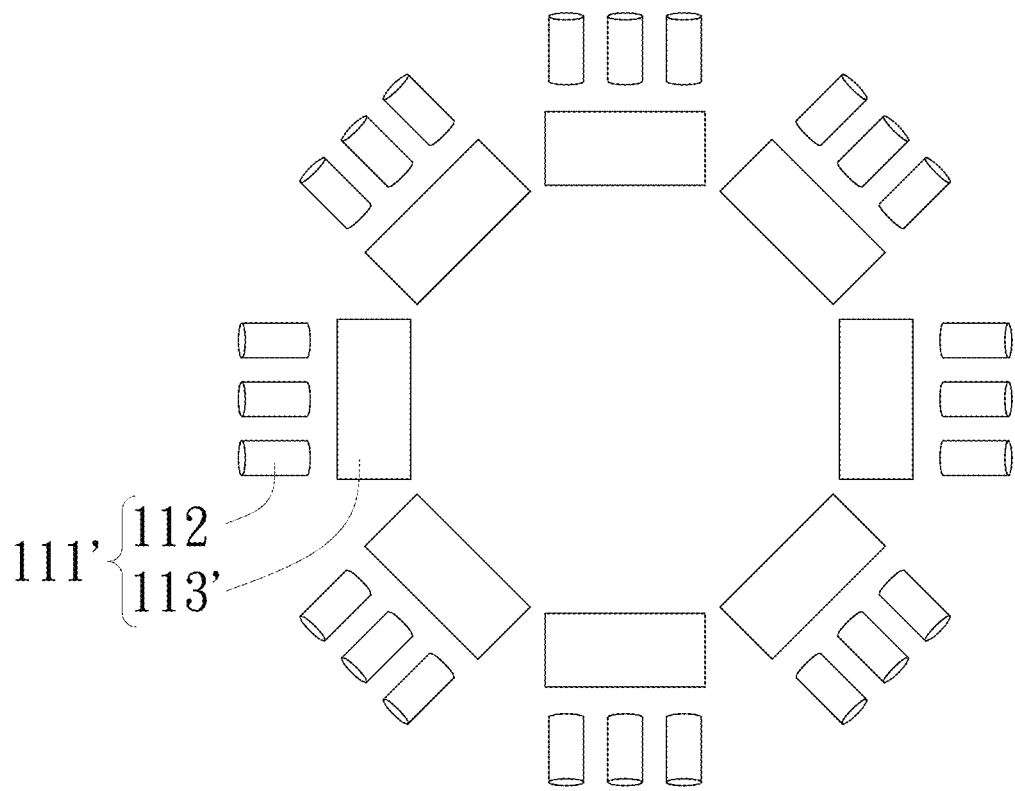
FIG. 6 is a front schematic diagram of a light source assembly of a light source device according to another embodiment of the invention.
Figure 7:
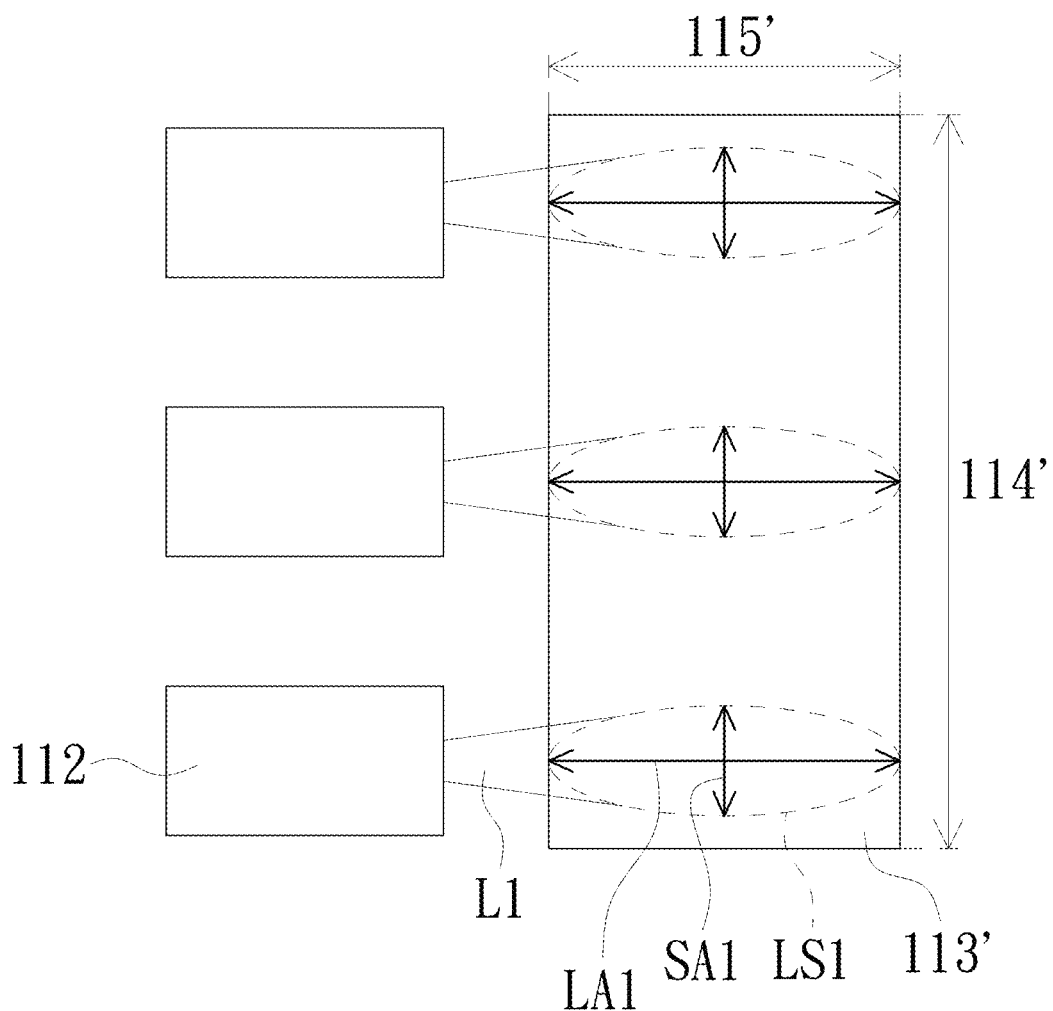
FIG. 7 is a schematic diagram of a light source combination of the light source assembly shown in FIG. 6.

FIG. 6 is a front schematic diagram of a light source assembly of a light source device according to another embodiment of the invention. FIG. 7 is a schematic diagram of a light source combination of the light source assembly shown in FIG. 6. Referring to FIGS. 6 and 7, in the embodiment, in each of the light source combinations 111' of each of the light source assemblies 110', the number of the excitation light source 112 is more than one. The embodiment is exemplified by three excitation light sources 112, and the number of the reflecting article 113' is one. The reflecting article 113' has a long axis 114' and a short axis 115' intersecting with the long axis 114'. Each of the laser lights L1 forms a light spot LS1 on the reflecting article 113'. The light spot LS1 has a light spot long axis LA1 and a light spot short axis SA1 intersecting with the light spot long axis LA1. The light spot long axis LA1 of the light spot LS1 may be parallel with the short axis 115' of the reflecting article 113'. The light spot short axis SA1 may be parallel with the long axis 114' of the reflecting article 113'. Since the light spots LS1 of the plurality of excitation light sources 112 have to be positioned in area of the reflecting articles 113', the area of the reflecting article 113' is larger than the area of the reflecting article 113. In addition, if other excitation light sources 112 having a small light spot size are used, a reflecting article 113' having the same area as that of the reflecting article 113 may be used, as long as the light spots of the plurality of excitation light sources 112 can be positioned in the area of the reflecting article 113'. In the embodiment, the light spot LS1 may be oval, and the shape of the reflecting article 113' is rectangular, but the invention is not limited thereto. In the following other embodiments of the light source device, in addition to the light source combinations 111, the light source combinations 111' may be used instead.

Figure 8:
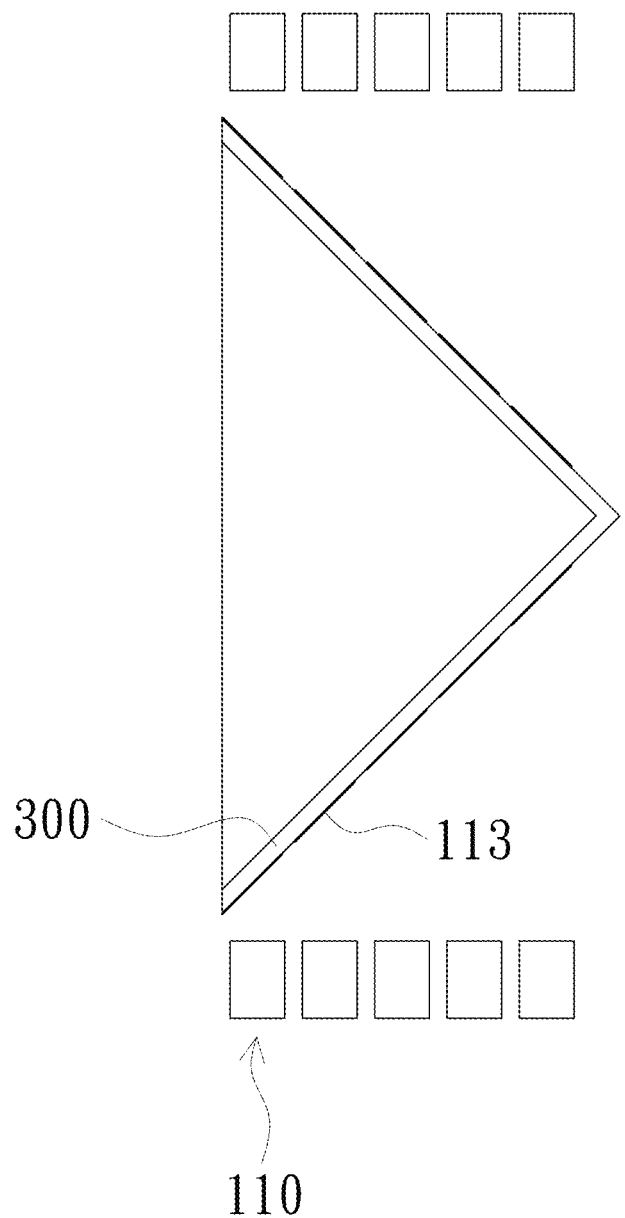
FIG. 8 is a cross-sectional schematic diagram of light source assemblies of a light source device according to another embodiment of the invention.

FIG. 8 is a cross-sectional schematic diagram of light source assemblies of a light source device according to another embodiment of the invention. Referring to FIG. 8, the reflecting articles 113 of the light source combinations 111 of the light source assemblies 110 are planar regions respectively, and the planar regions are disposed on a conical piece 300.

Figure 9:
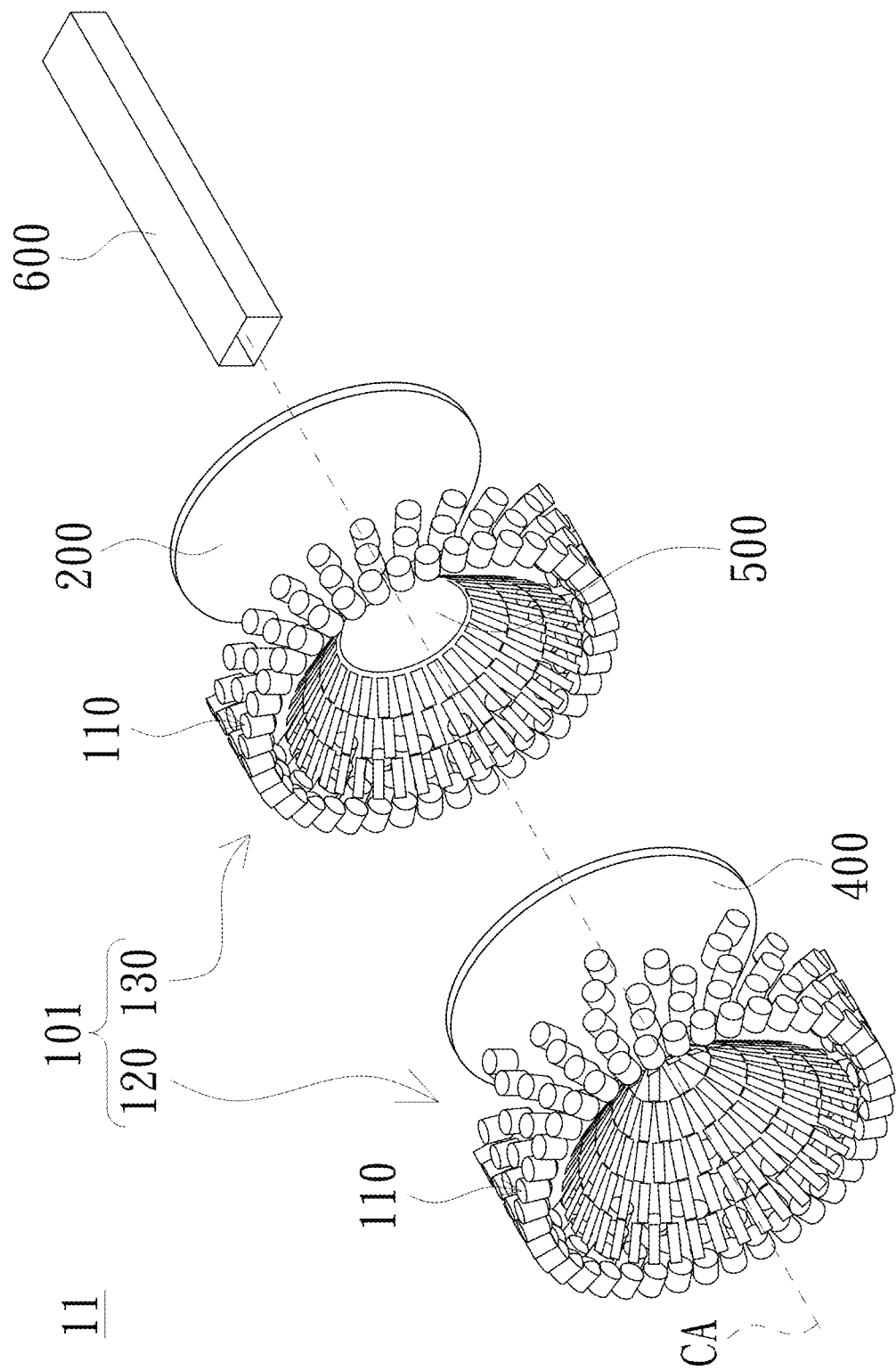
FIG. 9 is a schematic diagram of a light source device according to another embodiment of the invention.
Figure 10:
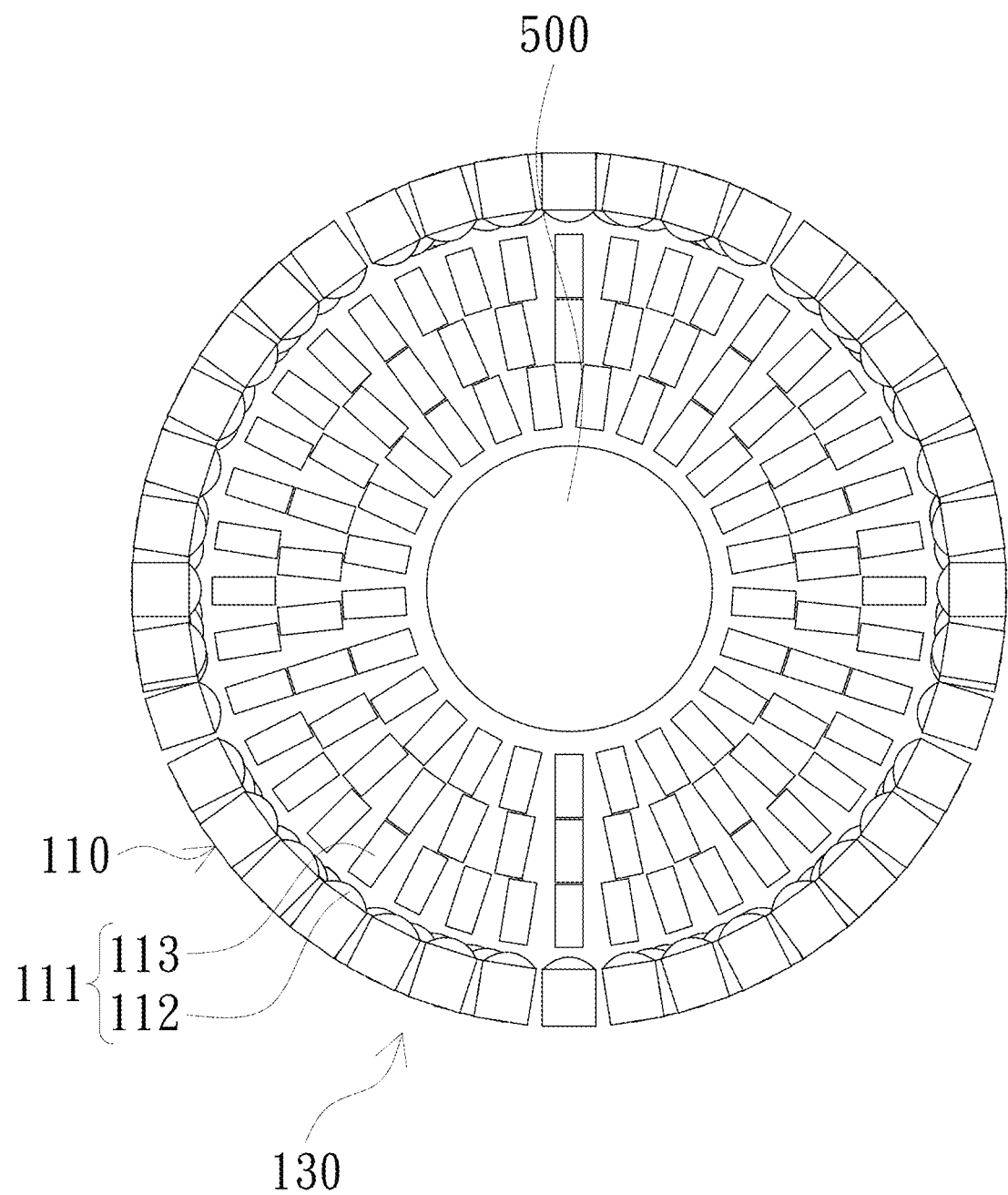
FIG. 10 is a front view of light source assemblies of a second part and a collimator lens shown in FIG. 9.
Figure 11:
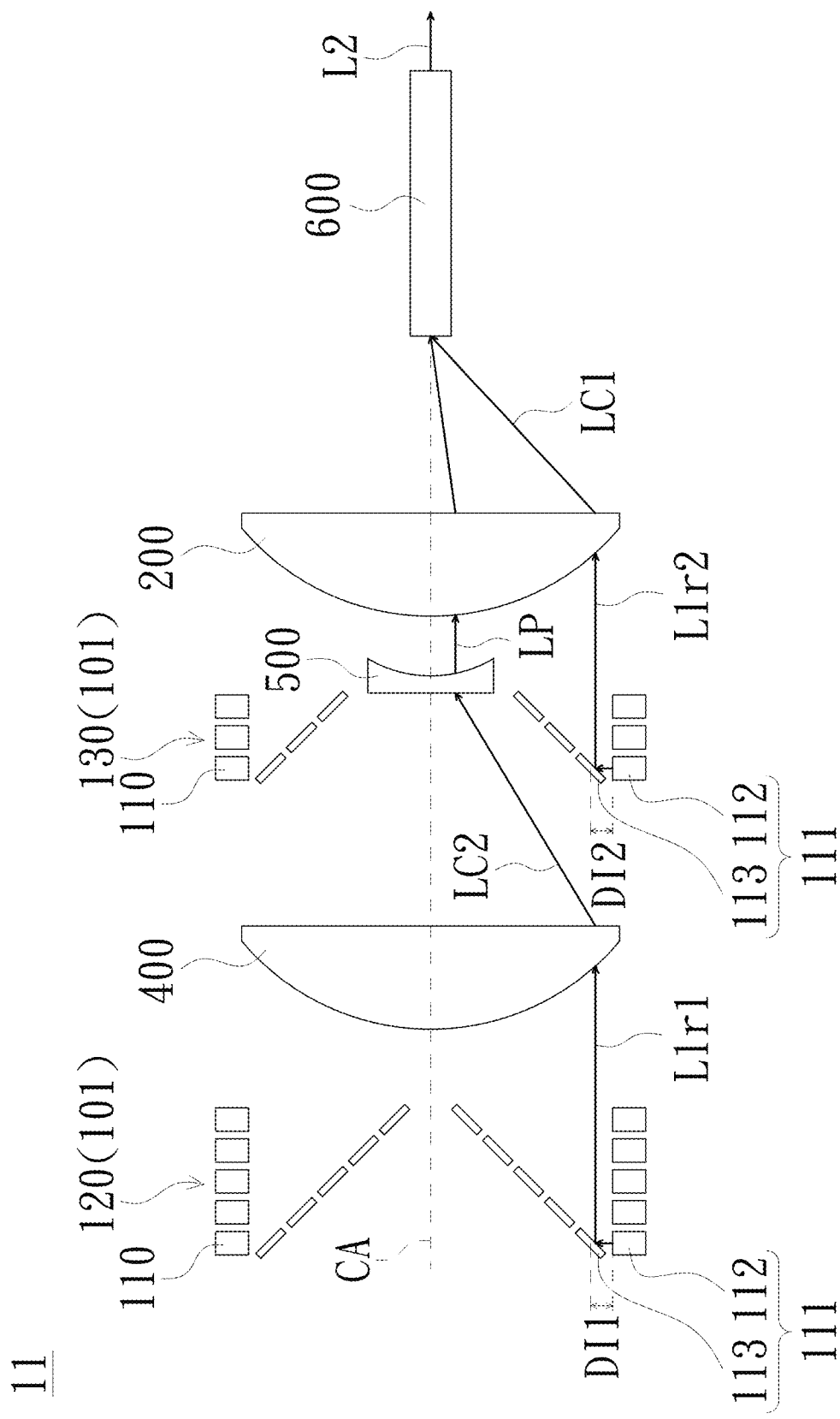
FIG. 11 is another schematic diagram of the light source device shown in FIG. 9.

FIG. 9 is a schematic diagram of a light source device according to another embodiment of the invention. FIG. 10 is a front view of light source assemblies of a second part and a collimator lens shown in FIG. 9. FIG. 11 is another schematic diagram of the light source device shown in FIG. 9. Referring to FIGS. 9 to 11, in the embodiment, the light source device 11 includes one light source module 101, and the number of the light source assembly 110 included in the light source module 101 is more than one. The light source device 11 is similar to the light source device 10, and the light source module 101 is similar to the light source module 100. The difference lies in that: the light source module 101 may further include a first part 120 and a second part 130, and the light source device 11 further includes a second condenser lens 400 and a collimator lens 500. The first part 120 includes at least one of the light source assemblies 110. The second part 130 includes at least one of the other of the light source assemblies 110. The light source assemblies 110 of the first part 120 form a plurality of first sub-reflected lights L1r1l. The light source assemblies 110 of the second part 130 form a plurality of second sub-reflected lights L1r2. Specifically, the reflected lights L1r (as shown in FIG. 3) include the first sub-reflected lights L1r1l and the second sub-reflected lights L1r2. The second condenser lens 400 is disposed between the first part 120 and the second part 130, and is positioned on the central axis CA. The second condenser lens 400 is configured to converge the first sub-reflected lights L1r1l from the light source assemblies 110 of the first part 120 into a second concentrating light LC2. The collimator lens 500 is disposed on the central axis CA. The light source combinations 111 of each of light source assemblies 110 of the second part 130 are arranged around the collimator lens 500. The collimator lens 500 is configured to collimate the second concentrating light LC2 into a collimated light LP. The first condenser lens 200 converges the second sub-reflected lights L1r2 from the light source assemblies 110 of the second part 130 and the collimated light LP into the first concentrating light LC1, so as to form the illumination beam L2. Accordingly, after passing through the second condenser lens 400 and the collimator lens 500, the first sub-reflected lights L1r1 formed by the light source assemblies 110 of the first part 120 are converged into the first concentrating light LC1 by the first condenser lens 200 with the second sub-reflected lights L1r2. In addition, the number of the light source assembly 110 included in the first part 120 may more or less than the number of the light source assembly 110 included in the second part 130. In the embodiment, the number of the light source assemblies 110 included in the light source module 101 is, for example, eight. The first part 120 has five of the eight light source assemblies 110, and the second part 130 has the other three of the eight light source assemblies 110, but the invention is not limited thereto. The number of the light source assembly 110 included in the first part 120 and the number of the light source assembly 110 included in the second part 130 may be adjusted as desired.

In the embodiment, the number of the light source assemblies 110 of the first part 120 is more than one, and the light source assemblies 110 of the first part 120 are sequentially arranged along the central axis CA toward the transmission direction of the illumination beam L2. A first distance DI1 is formed between the excitation light source 112 and the reflecting article 113 in each of the light source combinations 111 of each of the light source assemblies 110 of the first part 120. The first distances DI1 of the light source combinations 111 of the first part 120 increase along the central axis CA toward the transmission direction of the illumination beam L2; that is, in the first part 120, the first distance DI1 between the excitation light source 112 and the reflecting article 113 in each of the light source combinations 111 of the light source assembly 110 closest to the second condenser lens 400 is larger than the first distance DI1 between the excitation light source 112 and the reflecting article 113 in each of the light source combinations 111 of the adjacent light source assembly 110. Accordingly, a plurality of concentric speckle rings may be formed on the second condenser lens 400 by the first sub-reflected lights L1r1l from the light source assemblies 110 of the first part 120, and the concentric speckle rings are sequentially arranged on the second condenser lens 400 from the peripheral portion of the second condenser lens 400 to the center portion of the second condenser lens 400, and thus, the second condenser lens 400 is fully-utilized, and the light intensity of the illumination beam L2 is further increased.

In the embodiment, the number of the light source assemblies 110 of the second part 130 is more than one, and the light source assemblies 110 of the second part 130 are sequentially arranged along the central axis CA toward the transmission direction of the illumination beam L2. A second distance DI2 is formed between the excitation light source 112 and the reflecting article 113 in each of the light source combinations 111 of each of the light source assemblies 110 of the second part 130. The second distances DI2 of the light source combinations 111 of the second part 130 increase along the central axis CA toward the transmission direction of the illumination beam L2; that is, in the second part 130, the second distance DI2 between the excitation light source 112 and the reflecting article 113 in each of the light source combinations 111 of the light source assembly 110 closest to the first condenser lens 200 is larger than the second distance DI2 between the excitation light source 112 and the reflecting article 113 in each of the light source combinations 111 of the adjacent light source assembly 110. Accordingly, a plurality of concentric speckle rings may be formed on the first condenser lens 200 by the second sub-reflected lights L1r1l from the light source assemblies 110 of the second part 130, and the concentric speckle rings are sequentially arranged on the first condenser lens 200 from the peripheral portion of the first condenser lens 200 to the center portion of the first condenser lens 200, and thus, the first condenser lens 200 is fully-utilized, and the light intensity of the illumination beam L2 is further increased.

Figure 12:
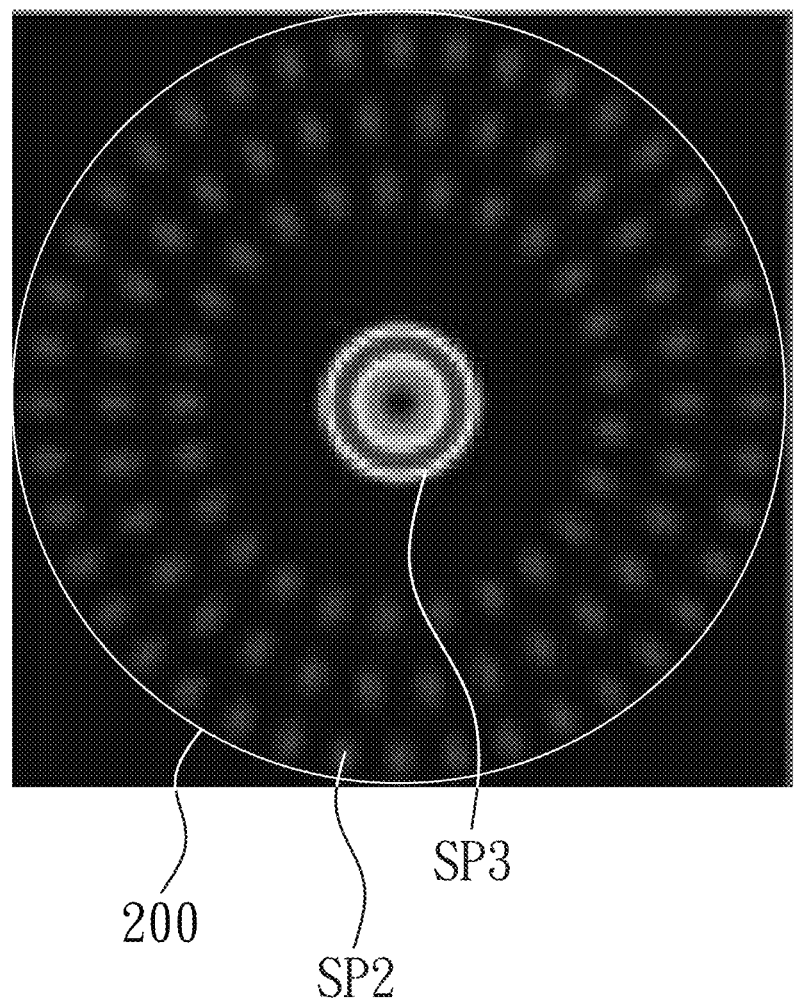
FIG. 12 is a simulation diagram of light spot pattern formed by illuminations of a collimated light and second sub-reflected lights shown in FIG. 11 on a first condenser lens.

FIG. 12 is a simulation diagram of light spot pattern formed by illuminations of the collimated light and the second sub-reflected lights shown in FIG. 11 on the first condenser lens. Referring to FIGS. 11 and 12, the laser lights from the excitation light source 112 of each of the light source assemblies 110 of the second part 130 are reflected by the reflecting article 113, and thereby forming the second sub-reflected lights L1r2. The second sub-reflected lights L1r2 form light spot pattern SP2 on the first condenser lens 200. The light spots of light spot pattern SP2 are circularly distributed. The light spot pattern SP2 may be distributed at the peripheral portion of the first condenser lens 200; in this way, the peripheral portion of the first condenser lens 200 may be utilized. In addition, since the light source combinations 111 of the light source assemblies 110 of the second part 130 are arranged around the collimator lens 500, the collimated light LP may form a speckle SP3 on the center portion of the first condenser lens 200, the center portion of the first condenser lens 200 may be utilized. Hence, the utilization efficiency of the first condenser lens 200 can be improved. Further, by improving the utilization efficiency of the first condenser lens 200, the light intensity of the first concentrating light LC1 can be increased, and thereby increasing the light intensity of the illumination beam L2. In the embodiment, by the cooperation of the light source assemblies 110 in the first part 120 and the light source assemblies 110 in the second part 130, the energy of the laser light L1 can be concentrated and the high-density accumulation of the laser light is achieved, so as to improve the light intensity of the illumination beam L2.

Figure 13:
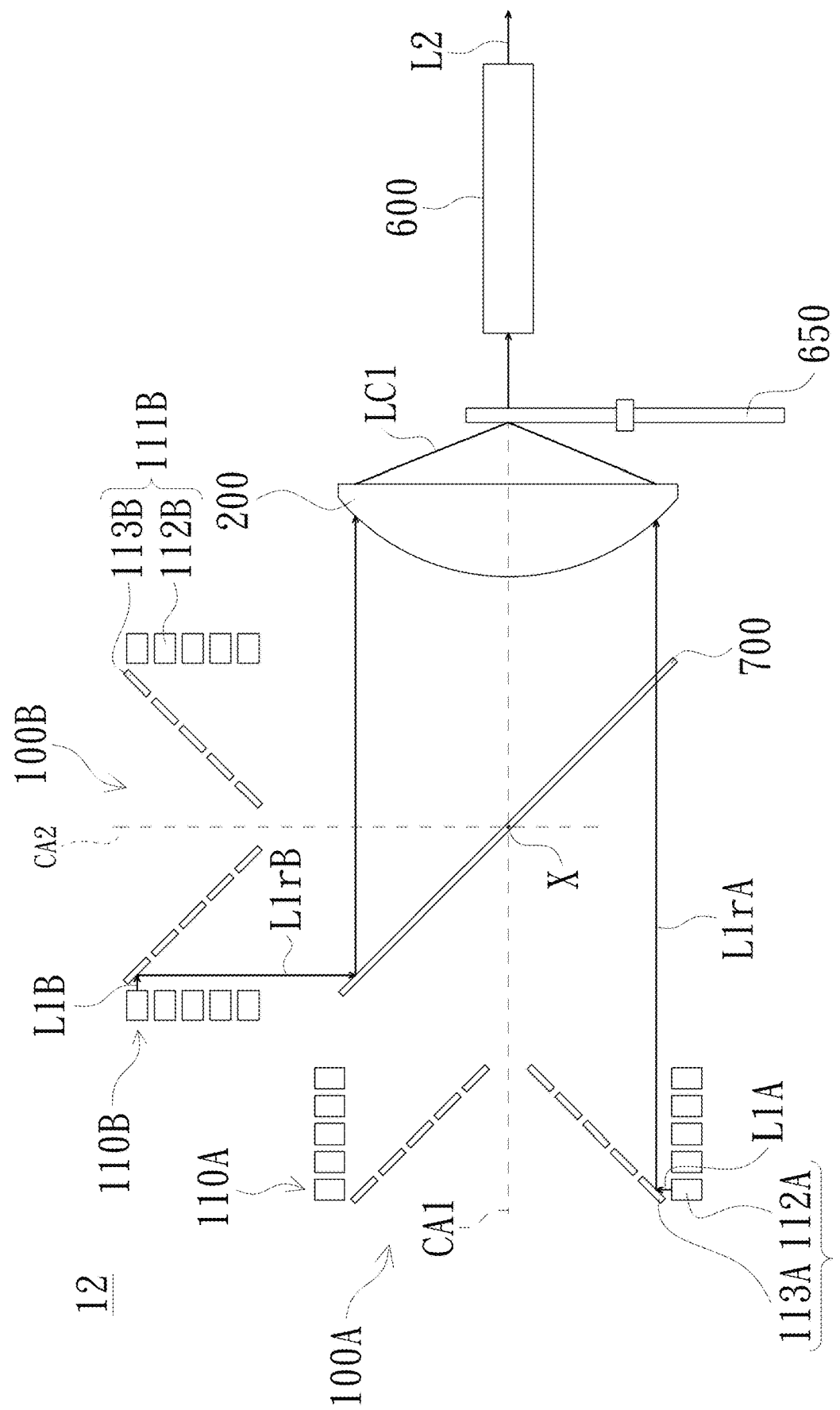
FIG. 13 is a schematic diagram of a light source device according to another embodiment of the invention.

FIG. 13 is a schematic diagram of a light source device according to another embodiment of the invention. Referring to FIG. 13, the light source device 12 further includes a diffusing element 650 configured to diffuse the first concentrating light LC1 to lower the energy of the first concentrating light LC1, so as to reduce the speckle phenomenon caused by the first collected light LC1. The diffusing element 650 is positioned between the first condenser lens 200 and the light homogenizing component 600. The first concentrating light LC1 directly enters and passes through the light homogenizing component 600 to form the illumination beam L2 after directly entering and passing through the diffusing element 650.

In the embodiment shown in FIG. 13, the number of the light source module of the light source device 12 is more than one, for example, two; that is, the first light source module 100A and the second light source module 100B. The light source device 12 further includes a first beam splitter 700. The beam splitter 700 is disposed between the first light source module 100A and the first condenser lens 200. The second light source module 100B is disposed at a side of the beam splitter 700 distal away from the first light source module 100A. The light source assembly included in the first light source module 100A is the first light source assembly 110A. The light source combinations included in the first light source assembly 110A are the first light source combinations 111A. The central axis surrounded by the first light source combinations 111A is the first central axis CA1. The reflecting article and the excitation light source included in each of the first light source combinations 111A are the first reflecting article 113A and the first excitation light source 112A. The laser light emitted from the first excitation light source 112A is the first laser light L1A. The reflected lights formed after the first laser lights L1A reflected by the first reflecting article 113A are the first reflected lights L1rA. Identically, the light source assembly included in the second light source module 100B is the second light source assembly 110B. The light source combinations included in the second light source assembly 110B are the second light source combinations 111B. The central axis surrounded by the second light source combinations 111B is the second central axis CA2. The reflecting article and the excitation light source included in each of the second light source combinations 111B are the second reflecting article 113B and the second excitation light source 112B. The laser light emitted from the second excitation light source 112B is the second laser light L1B. The reflected lights formed after the second laser lights L1B reflected by the second reflecting article 113B are the second reflected lights L1rB. The first beam splitter 700 is configured to transmit the first reflected lights L1rA and reflect the second reflected lights L1rB. The first condenser lens 200 is configured to converge the first reflected lights L1rA and the second reflected lights L1rB after the first reflected lights L1rA and the second reflected lights L1rB pass the first beam splitter 700 into the first concentrating light LC1, so as to form the illumination beam L2. In addition, a type of the first excitation light sources 112A included in the first light source module 100A and a type the second excitation light sources 112B included in the second light source module 100B are consisted of the red excitation source, the green excitation source, and the blue excitation source.

The type of the first excitation light source 112A included in the first light source module 100A may be consisted of the red laser source, be consisted of the green laser source, or the blue laser source. The type of the second excitation light source 112B included in the second light source module 100B may consisted of at least two of the red laser source, the green laser source, and the blue laser source. For example, when the type of the first excitation light source 112A included in the first light source module 100A is the green laser source, the type of the second excitation light source 112B included in the second light source module 100B may be consisted of the red laser source and the blue laser source. In other embodiments, as desired, when the type of the first excitation light source 112A included in the first light source module 100A is the green laser source, the type of the second excitation light source 112B included in the second light source module 100B may also be consisted of the red laser source, the green laser source, and the blue laser source. In still other embodiments, as desired, when the type of the first excitation light source 112A included in the first light source module 100A is consisted of the red laser source and the green laser source, the second excitation light source 112B included in the second light source module 100B may be consisted of the red laser source and the blue laser source. In other words, the distribution and arrangement of the first excitation light source 112A and the second excitation light source 112B included in the first light source module 100A and the second light source module 100B are not limited in the invention, so long so the red laser source, the green laser source, and the blue laser source are included in the light source assemblies 110A, 110B of the first light source module 100A and the second light source module 100B. In addition, the first central axis CA1 and the second central axis CA2 intersect at an interaction point X. The first beam splitter 700 passes through the intersection point X. Meanwhile, in the embodiment, the first reflected lights L1rA may be parallel to the first central axis CA1, and the second reflected lights L1rB may be parallel to the second central axis CA2. Further, a number of the first light source assembly 110A may be one or more, and a number of the second light source assembly may be one or more.

In the embodiment shown in FIG. 13, by the first beam splitter 700, the first reflected lights L1rA from the first light source module 100A and the second reflected lights L1rB from the second light source module 100B transmit toward the direction to the first condenser lens 200. In this way, the first condenser lens 200 can converge the first reflected lights L1rA and the second reflected lights L1rB, and the first concentrating light LC1 with high energy is obtained, and thereby increasing the light intensity of the illumination beam L2.

Figure 14:
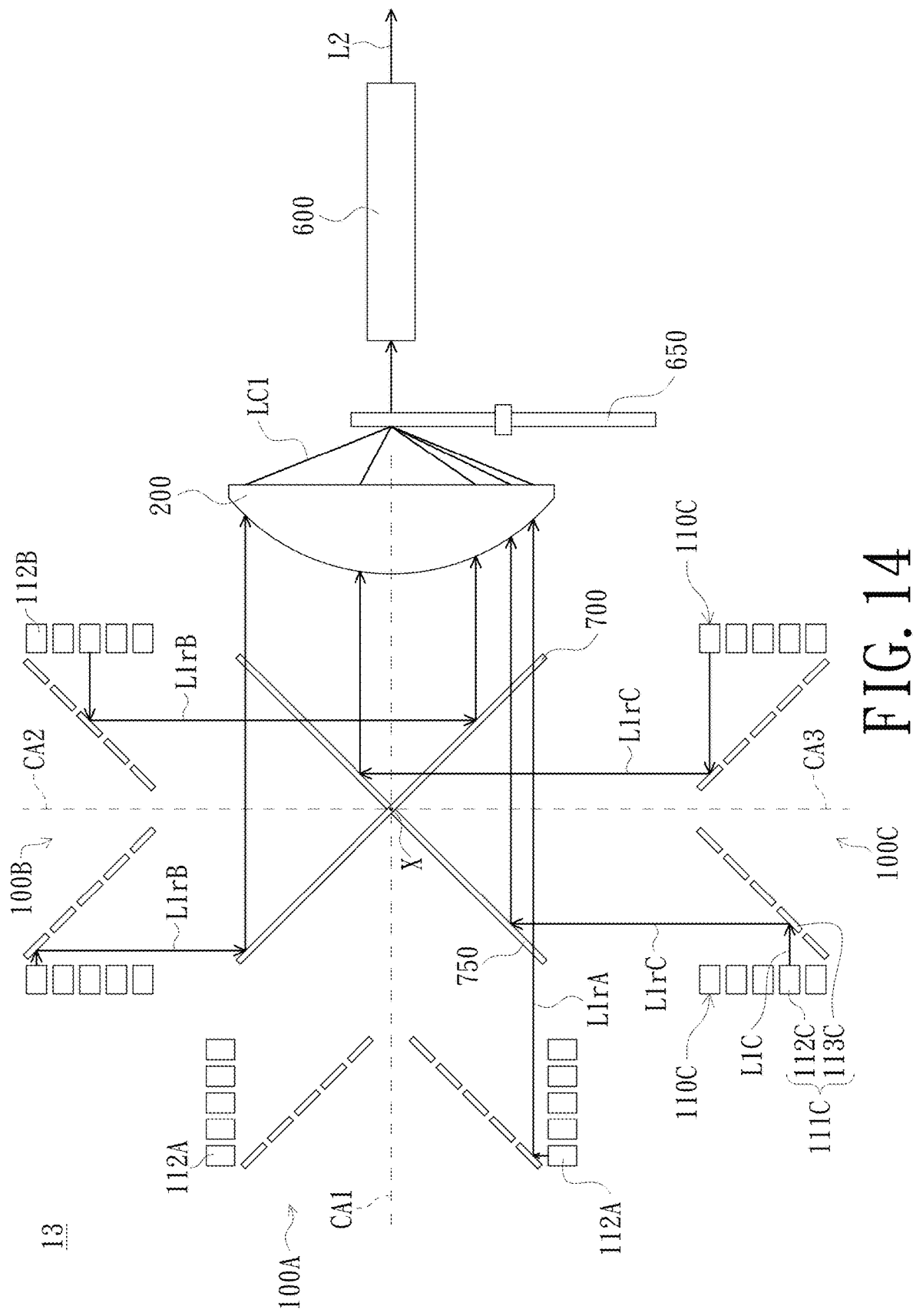
FIG. 14 is a schematic diagram of a light source device according to another embodiment of the invention.

FIG. 14 is a schematic diagram of a light source device according to another embodiment of the invention. Referring to FIG. 14, the number of the light source module of the light source device 13 is three, that is, the first light source module 100A, the second light source module 100B, and the third light source module 100C. The light source device 13 further includes a second beam splitter 750. The second beam splitter 750 is adjacent to the first beam splitter 700 and is disposed between the first light source module 100A, the second light source module 100B, and the third light source module 100C. The third light source module 100C is disposed at a side of the second beam splitter 750 distal away from the second light source module 100B. The light source assembly included in the third light source module 100C is the third light source assembly 110C. The light source combinations included in the third light source assembly 110C is the third light source combinations 111C. The central axis surrounded by the third light source combination 111C is the third central axis CA3. The excitation light source and the reflecting article included in each of the third light source combinations are the third excitation light source 112C and the reflecting article 113C. The laser lights emit from the third excitation light source 112C is the third laser lights L1C. The reflected lights formed after the third laser lights L1C reflected by the third reflecting article 113C are the third reflected lights L1rC. The second beam splitter 750 is configured to transmit the first reflected lights L1rA and the second reflected lights L1rB, and reflect the third reflected lights L1rC. The first beam splitter 700 is configured to transmit the first reflected lights L1rA and the third reflected lights L1rC, and reflect the second reflected lights L1rB. The first condenser lens 200 is configured to converge the first reflected lights L1rA, the second reflected lights L1rB, and the third reflected lights L1rC after the first reflected lights L1rA, the second reflected lights L1rB, and the third reflected lights L1rC pass the first beam splitter 700 and the second beam splitter 750 into the first concentrating light LC1, so as to form the illumination beam L2. A type of the first excitation light sources 112A included in the first light source module 100A, a type the second excitation light sources 112B included in the second light source module 100B, and a type the third excitation light sources 112C included in the third light source module 100C are consisted of the red excitation source, the green excitation source, and the blue excitation source.

In the embodiment shown in FIG. 14, the type of the first excitation light sources 112A included in the first light source module 100A is consisted of the red excitation source, is consisted of the green excitation source, or is consisted of the blue excitation source. The type the second excitation light sources 112B included in the second light source module 100B is consisted of the red excitation source, is consisted of the green excitation source, or is consisted of the blue excitation source. The type of the third excitation light sources 112C included in the third light source module 100C is consisted of the red excitation source, is consisted of the green excitation source, or is consisted of the blue excitation source. The type of the first excitation light sources 112A included in the first light source module 100A, the type of the second excitation light sources 112B included in the second light source module 100B, and the type of the third excitation light sources 112C included in the third light source module 100C are different. For example, the type of the first excitation light sources 112A included in the first light source module 100A may be the blue excitation source, the type the second excitation light sources 112B included in the second light source module 100B may be the red excitation source, and the type of the third excitation light sources 112C included in the third light source module 100C may be the green excitation source, but the invention is not limited thereto. In other embodiments, for instance, the type of the first excitation light sources 112A included in the first light source module 100A may be the red excitation source, the type the second excitation light sources 112B included in the second light source module 100B may be the green excitation source, and the type of the third excitation light sources 112C included in the third light source module 100C may be the blue excitation source. In still other embodiments, the type of the first excitation light source 112A included in the first light source module 100A may be consisted of at least two of the red laser source, be consisted of the green laser source, or the blue laser source, the type of the second excitation light source 112B included in the second light source module 100B may consisted of at least two of the red laser source, the green laser source, and the blue laser source, and the type of the third excitation light sources 112C included in the third light source module 100C may be consisted of at least two of the red laser source, the green laser source, and the blue laser source. In other words, the distribution and arrangement of the first excitation light source 112A included in the first light source module 100A, the second excitation light source 112B included in the second light source module 100B, and the third excitation light sources 112C included in the third light source module 100C are not limited in the invention, so long so the red laser source, the green laser source, and the blue laser source are included in the light source assemblies 110A, 110B, 110C of the first light source module 100A, the second light source module 100B, and the third light source module 100C. In addition, the first central axis CA1, the second central axis CA2, and the third central axis CA3 intersect at the interaction point X. The first beam splitter 700 and the second beam splitter 750 cross with each other and are disposed at the intersection point X. Meanwhile, in the embodiment, the first reflected lights L1rA may be parallel to the first central axis CA1, the second reflected lights L1rB may be parallel to the second central axis CA2, and the third reflected lights L1rC may be parallel to the third central axis CA3. Further, a number of the third light source assembly 110C may be one or more.

In the embodiment shown in FIG. 14, by the first beam splitter 700 and the second beam splitter 750, the first reflected lights L1rA from the first light source module 100A, the second reflected lights L1rB from the second light source module 100B, and the third reflected lights L1rC from the third light source module 100C transmit toward the direction to the first condenser lens 200. In this way, the first condenser lens 200 can converge the first reflected lights L1rA, the second reflected lights L1rB, and the third reflected lights L1rC, and the first concentrating light LC1 with high energy is obtained, and thereby increasing the light intensity of the illumination beam L2.

Figure 15:
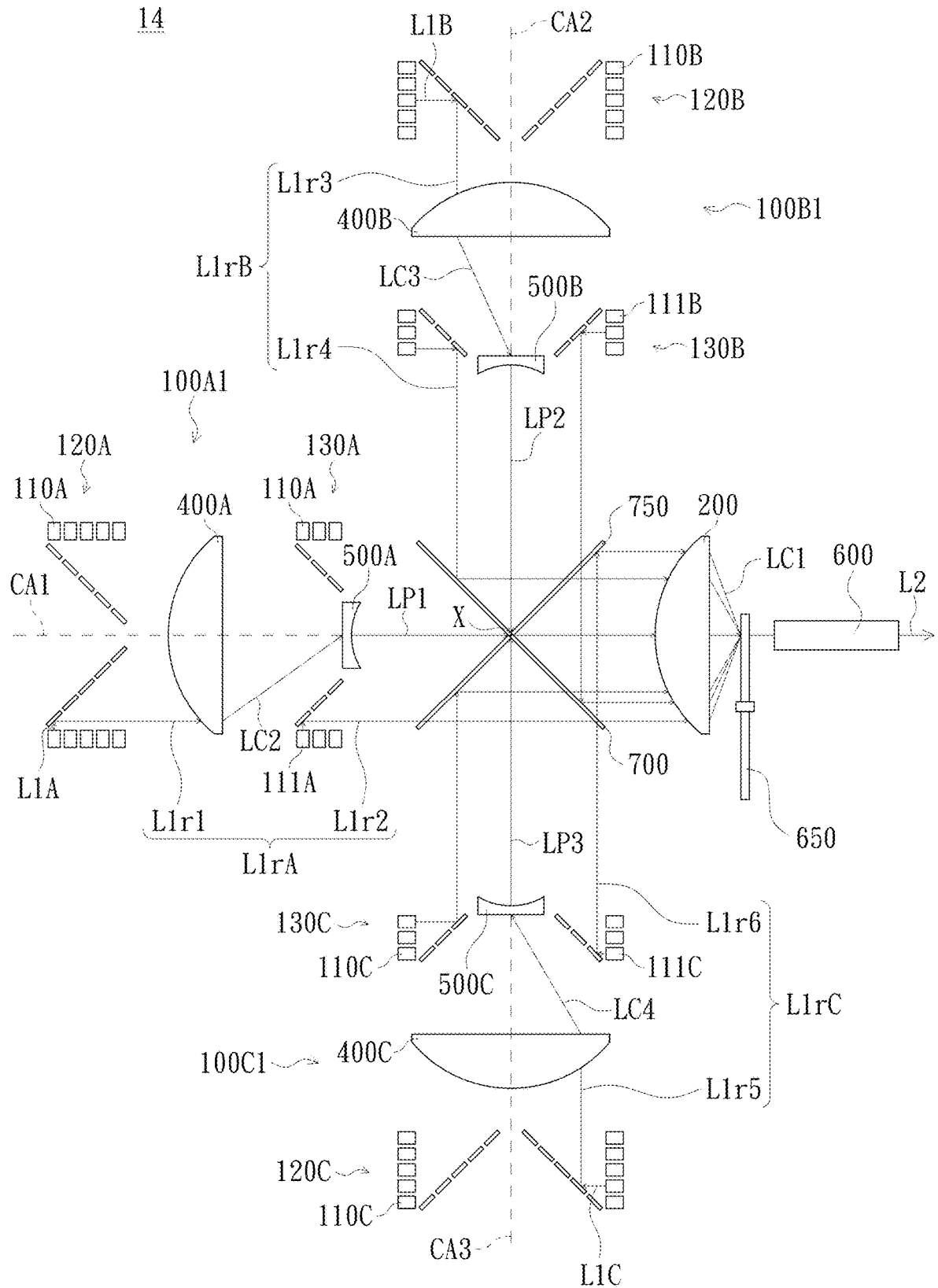
FIG. 15 is a schematic diagram of a light source device according to another embodiment of the invention.

FIG. 15 is a schematic diagram of a light source device according to another embodiment of the invention. Referring to FIG. 15, in the embodiment, the light source device 14 includes three light source module, for example, the first light source module 100A1, the second light source module 100B1, and the third light source module 100C1. The number of the first light source assembly 110A included in the first light source module 100A1 is more than one, the number of the second light source assembly 110B included in the second light source module 100B1 is more than one, and the number of the third light source assembly 110C included in the third light source module 100C1 is more than one. The first light source assemblies 110A are sequentially arranged along the first central axis CA1, the second light source assemblies 110B are sequentially arranged along the second central axis CA2, and the third light source assemblies 110C are sequentially arranged along the third central axis CA3. The light source device 14 is similar to the light source device 13. The first light source module 100A1, the second light source module 100B1, and the third light source module 100C1 are similar to the first light source module 100A, the second light source module 100B, and the third light source module 100C, respectively. The difference lies in that: the first light source module 100A1 includes a first part 120A and a second part 130A, the second light source module 100B1 includes a third part 120B and a fourth part 130B, the third light source module 100C1 includes a fifth part 120C and a sixth part 130C, and the light source device 14 further includes a second condenser lens 400A, a first collimator lens 500A, a third condenser lens 400B, a second collimator lens 500B, a fourth condenser lens 400C, and a third collimator lens 500C.

The first part 120A includes at least one of the first light source assemblies 110A, the second part 130A includes at least one of the other of the first light source assemblies 110A. The at least one first light source assembly 110A in the first part 120A forms a plurality of first sub-reflected lights L1r1. The at least one first light source assembly 110A in the second part 130A forms a plurality of second sub-reflected lights L1r2. The first reflected lights L1rA include the first sub-reflected lights L1r1 and the second sub-reflected lights L1r2. The second condenser lens 400A is disposed between the first part 120A and the second part 130A. The second condenser lens 400A is configured to converge the first sub-reflected lights L1r1l into a second concentrating light LC2. The first collimator lens 500A is disposed on the first central axis CA1. The first light source combinations 111A of each of the at least one first light source assembly 110A in the second part 130A are arranged around the first collimator lens 500A. The first collimator lens 500A is configured to collimate the second concentrating light LC2 into a first collimated light LP1.

The third part 120B includes at least one of the second light source assemblies 110B. The fourth part 130B includes at least one of the other of the second light source assemblies 110B. The at least one second light source assembly 110B in the third part 120B forms a plurality of third sub-reflected lights L1r3. The at least one second light source assembly 110B in the fourth part 130B forms a plurality of fourth sub-reflected lights L1r4. The second reflected lights L1rB include the third sub-reflected lights L1r3 and the fourth sub-reflected lights L1r4. The third condenser lens 400B is disposed between the third part 120B and the fourth part 130B. The third condenser lens 400B is configured to converge the third sub-reflected lights L1r3 into a third concentrating light LC3. The second collimator lens 500B is disposed on the second central axis CA2. The second light source combinations 111B of each of the second light source assembly 110B in the fourth part 130B are arranged around the second collimator lens 500B. The second collimator lens 500B is configured to collimate the third concentrating light LC3 into a second collimated light LP2.

The fifth part 120C includes at least one of the third light source assemblies 110C. The sixth part 130C includes at least one of the other of the third light source assemblies 110C. The at least one third light source assembly 110C in the fifth part 120C forms a plurality of fifth sub-reflected lights L1r5. The at least one third light source assembly 110C in the sixth part 130C forms a plurality of sixth sub-reflected lights L1r6. The third reflected lights L1rC include the fifth sub-reflected lights L1r5 and the sixth sub-reflected lights L1r6. The fourth condenser lens 400C is disposed between the fifth part 120C and the sixth part 130C. The fourth condenser lens 400C is configured to converge the fifth sub-reflected lights L1r5 into a fourth concentrating light LC4. The third collimator lens 500C is disposed on the third central axis CA3. The third light source combinations 111C of each of the at least one third light source assembly 110C in the sixth part 130C are arranged around the third collimator lens 500C. The third collimator lens 500C is configured to collimate the fourth concentrating light LC4 into a third collimated light LP3.

The second beam splitter 750 is configured to transmit the second sub-reflected lights L1r2, the fourth sub-reflected lights L1r4, the first collimated light LP1, and the second collimated light LP2, and reflect the sixth sub-reflected lights L1r6 and the third collimated light LP3. The first beam splitter 700 is configured to transmit the second sub-reflected lights L1r2, the sixth sub-reflected lights L1r6, the first collimated light LP1, and the third collimated light LP3, and reflect the fourth sub-reflected lights L1r4 and the second collimated light LP2. The first condenser lens 200 is configured to converge the second sub-reflected lights L1r2, the fourth sub-reflected lights L1r4, the sixth sub-reflected lights L1r6, the first collimated light LP1, the second collimated light LP2, and the third collimated light LP3 into the first concentrating light LC1, so as to form the illumination beam L2.

In the embodiment, with the configuration of the first light source assembly 110A of the first part 120A, the first light source assembly 110A of the second part 130A, the second light source assembly 110B of the third part 120B, the second source assembly of the fourth part 130B, the third light source assembly 110C of the fifth part 120C, the third light source assembly 110C of the sixth part 130C, the second condenser lens 400A, the first collimator lens 500A, the third condenser lens 400B, the second collimator lens 500B, the fourth condenser lens 400C, the third collimator lens 500C, and the first condenser lens 200, the energy of the first laser lights L1A, the second laser lights L1B, and the third laser lights L1C are concentrated, so as to achieve the efficacy of high-density accumulation of laser lights, so as to increase the light intensity of the illumination beam L2.

Back to FIG. 3, FIG. 3 is a schematic diagram of a projection apparatus having the light source device shown in FIG. 1 according to an embodiment of the invention. Referring to FIGS. 1 to 3, the projection apparatus 800 of the embodiment includes a light source device 10, a light valve 810, and a projection lens 820. The light source device 10 provides an illumination beam L2. The light valve 810 is disposed on a transmission path of the illumination beam L2 to form an image beam L3. The projection lens 820 is disposed on a transmission path of the image beam L3 to project the image beam L3 onto a screen 900, so as to form an image on the screen 900. In addition, the light valve 810 may be a transmissive light valve or a reflective light valve. The transmissive light valve may be a transmissive liquid crystal panel, and the reflective light valve may be a digital micro-mirror device (DMD) or a liquid crystal on silicon (LCOS) panel, but the invention is not limited thereto. The projection lens 820 may include, for example, one or a combination of a plurality of optical lenses having diopter, such as a various combinations of non-planar lenses including biconcave lenses, biconvex lenses, concavo-convex lenses, convexo-concave lenses, plano-convex lenses, and plano-concave lenses. In an embodiment, the projection lens 820 may also include a planar optical lens. Although FIG. 3 illustrates the light source device 10 in FIG. 1 as an example, the light source device 10 may be replaced with light source device of any one of the above-mentioned embodiments; for example, the light source device 10 may be replaced with the light source device 11, the light source device 12, the light source device 13, or the light source device 14.

Since the type of the excitation light source included in the light source module 100 of the light source device 10 is consisted of the red laser source, the green laser source, and the blue laser source, the illumination beam L2 provided by the light source device 10 can be a desired color light, for example, white light, yellow light, red light, green light, etc., the illumination beam L2 does not need to undergo wavelength conversion by a wavelength conversion element such as a wavelength-converting wheel before entering the light valve 810, and does not need to pass through a filter element such as a filter wheel for light-filtering. Therefore, the use of the wavelength conversion element and the filter element can be omitted in the projection apparatus 800 of the embodiment.

To summarize, in the light source device and the projection apparatus of the embodiments of the invention, since the light source combinations of the light source assembly are arranged around the central axis, and the reflecting article is disposed between the excitation light source and the central axis, the reflecting lights formed by reflecting the laser lights of the excitation light sources of the light source assembly by the reflecting articles may form circularly-distributed light spot pattern on a peripheral portion of the first condenser lens. Therefore, the peripheral portion of the condenser lens is utilized, and utilization efficiency of the first condenser lens is improved. In addition, since the mixing of the laser lights of the excitation light source of the light source combinations is achieved by the cooperation of the reflecting articles of the light source combinations and the first condenser lens, the configuration is simple and the cost is low. Further, since the type of the excitation light sources included in the light source module is consisted of the red laser source, the green laser source, and the blue laser source, the color gamut of the light source device and the projection apparatus may reach REC. 2020 standard. Accordingly, the light source device and the projection apparatus have advantages of improving the utilization efficiency of condenser lens, simple configuration, low cost, and wide color gamut.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "The invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. Furthermore, the terms such as the first light source module, the second light source module, the third light source module, the first light source assembly, the second light source assembly, the third light source assembly, the first light source combination, the second light source combination, the third light source combination, the first excitation light source, the second excitation light source, the third excitation light source, the first reflecting article, the second reflecting article, the third reflecting article, the first central axis, the second central axis, the third central axis, the first part, the second part, the third part, the fourth part, the fifth part, the sixth part, the first distance, the second distance, the first condenser lens, the second condenser lens, the third condenser lens, the fourth condenser lens, the first collimator lens, the second collimator lens, the third collimator lens, the first beam splitter, the second beam splitter, the first laser light, the second laser light, the third laser light, the first reflected light, the second reflected light, the third reflected light, the first sub-reflected light, the second sub-reflected light, the third sub-reflected light, the fourth sub-reflected light, the fifth sub-reflected light, the sixth sub-reflected light, the first concentrating light, the second concentrating light, the third concentrating light, fourth concentrating light, the first collimated light, the second collimated light, the third collimated light, and so on, are only used for distinguishing various elements and do not limit the number of the elements.

What is claimed is:

1. A light source device, comprising:
a light source module comprising at least one light source assembly, each of the at least one light source assembly comprising a plurality of light source combinations, the light source combinations arranged around a central axis, each of the light source combinations comprising an excitation light source and a reflecting article, the reflecting article disposed between the central axis and the excitation light source for reflecting an excitation light of the excitation light source to form an illumination beam, wherein a type of the excitation light sources included in the light source module is consisted of a red excitation source, a green excitation source, and a blue excitation source,
wherein a number of the at least one of the light source assembly is plural, the light source assemblies are sequentially arranged along the central axis,
wherein the reflecting articles of the light source combinations of the light source assemblies reflect the excitation lights and a plurality of reflected lights are formed, transmission directions of the reflected lights are parallel with the central axis, the light source device further comprises a first condenser lens, the first condenser lens is configured to converge the reflected lights into a first concentrating light to form the illumination beam,
wherein the light source module comprises a first part and a second part, the light source device further comprises a second condenser lens and a collimator lens, the first part comprises at least one of the light source assemblies, the second part comprises at least one of the other of the light source assemblies, the at least one light source assembly in the first part forms a plurality of first sub-reflected lights, the at least one other light source assembly in the second part forms a plurality of second sub-reflected lights, the reflected lights comprise the first sub-reflected lights and the second sub-reflected lights, the second condenser lens is disposed between the first part and the second part, the second condenser lens is configured to converge the first sub-reflected lights into a second concentrating light, and the collimator lens is disposed on the central axis, the light source combinations of each of the at least one of the light source assemblies in the second part are arranged around the collimator lens, the collimator lens is configured to collimate the second concentrating light into a collimated light, and the first condenser lens converges the second sub-reflected lights and the collimated light into the first concentrating light, so as to form the illumination beam.

2. The light source device according to claim 1, wherein in each of the light source combinations, an angle between the reflecting article and a transmission direction of the excitation light of the excitation light source is 45°, and the central axis is parallel to a transmission direction of the illumination beam.

3. The light source device according to claim 1, wherein the light source combinations of each of the at least one light source assembly are arranged around the central axis at a same distance, and the reflecting articles are planar reflecting articles arranged individually.

4. The light source device according to claim 1, wherein in each of the light source combinations, a number of the excitation light source is one, the reflecting article has a long axis and a short axis intersecting with the long axis, and a light spot long axis of a light spot formed on the reflecting article by the excitation light of the excitation light source is parallel with the long axis of the reflecting article.

5. The light source device according to claim 1, wherein in each of the light source combinations, a number of the excitation light source is plural, the reflecting article has a long axis and a short axis intersecting with the long axis, and a light spot long axis of a light spot formed on the reflecting article by the excitation light of each of the excitation light sources is parallel with the short axis of the reflecting article.

6. The light source device according to claim 1, wherein a distance is formed between the excitation light source and the reflecting article in each of the light source combinations of each of the light source assemblies, and the distances of the light source assemblies increase along the central axis toward a transmission direction of the illumination beam.

7. The light source device according to claim 6, wherein the reflecting articles of the light source combinations of the light source assemblies are a plurality of planar regions disposed on a conical piece respectively.

8. The light source device according to claim 1, wherein a type of the excitation light sources included in each of the light source assemblies is consisted of the red excitation source, is consisted of the green excitation source, or is consisted of the blue excitation source.

9. The light source device according to claim 1, wherein a type of the excitation light sources included in each of the light source assemblies is consisted of at least two of the red excitation source, the green excitation source, and the blue excitation source.

10. A light source device, comprising:
a first light source module, comprising at least one first light source assembly, each of the at least one first light source assembly comprising a plurality of first light source combinations, the first light source combinations arranged around a first central axis, each of the first light source combinations comprising:
a first excitation light source; and
a first reflecting article, disposed between the first excitation light source and the first central axis for reflecting a first excitation light of the first excitation light source;
a first condenser lens;
a first beam splitter, disposed between the first light source module and the first condenser lens; and
a second light source module, disposed at a side of the first beam splitter distal away from the first light source module and comprising at least one second light source assembly, each of the at least one second light source assembly comprising a plurality of second light source combinations, the second light source combinations arranged around a second central axis, each of the second light source combinations comprising:
a second excitation light source; and
a second reflecting article, disposed between the second excitation light source and the second central axis for reflecting a second excitation light of the second excitation light source;
wherein the first reflecting articles of the first light source combinations of the at least one first light source assembly reflect the first excitation lights and a plurality of first reflected lights are formed, the second reflecting articles of the second light source combinations of the at least one second light source assembly reflect the second excitation lights and a plurality of second reflected lights are formed, the first beam splitter is configured to be transmitted by the plurality of first reflected lights and is configured to reflect the plurality of second reflected lights, the first condenser lens is configured to converge the plurality of first reflected lights and the plurality of second reflected lights after the plurality of first reflected lights and the plurality of second reflected lights pass the first beam splitter into a first concentrating light, so as to form an illumination beam; and
a type of the first excitation light sources included in the first light source module and a type the second excitation light sources included in the second light source module are consisted of a red excitation source, a green excitation source, and a blue excitation source.

11. The light source device according to claim 10, wherein the type of the first excitation light sources included in the first light source module is consisted of the red excitation source, is consisted of the green excitation source, or is consisted of the blue excitation source, and the type of the second excitation light sources in the second light source module is consisted of at least two of the red excitation source, the green excitation source, and the blue excitation source.

12. The light source device according to claim 10, wherein the first central axis and the second central axis intersect at an intersection point and the first beam splitter passes through the intersection point.

13. The light source device according to claim 12, wherein the light source device further comprises:
a second beam splitter, adjacent to the first beam splitter and disposed between the first light source module, the first condenser lens, and the second light source module; and
a third light source module, disposed at a side of the second beam splitter distal away from the second light source module and comprising at least one third light source assembly, each of the at least one third light source assembly comprising a plurality of third light source combinations, the third light source combinations arranged around a third central axis, each of the third light source combinations comprising:
a third excitation light source; and
a third reflecting article, disposed between the third excitation light source and the third central axis for reflecting a third excitation light of the third excitation light source;
wherein the third reflecting articles of the third light source combinations of the at least one third light source assembly reflect the third excitation lights and a plurality of third reflected lights are formed, the second beam splitter is configured to transmit the plurality of first reflected lights and the plurality of second reflected lights, and reflect the plurality of third reflected lights, the first beam splitter is configured to transmit the plurality of first reflected lights and the plurality of third reflected lights, and reflect the plurality of second reflected lights, the first condenser lens is configured to converge the plurality of first reflected lights, the plurality of second reflected lights, and the plurality of third reflected lights after the plurality of first reflected lights, the plurality of second reflected lights, and the plurality of third reflected lights pass the first beam splitter and the second beam splitter into the first concentrating light to form the illumination beam; and the type of the first excitation light sources included in the first light source module, the type the second excitation light sources included in the second light source module, and a type the third excitation light sources included in the third light source module are consisted of the red excitation source, the green excitation source, and the blue excitation source.

14. The light source device according to claim 13, wherein the first central axis, the second central axis, and the third central axis intersect at the intersection point, and the first beam splitter and the second beam splitter are disposed at the intersection point.

15. The light source device according to claim 13, wherein the type of the first excitation light sources included in the first light source module is consisted of the red excitation source, is consisted of the green excitation source, or is consisted of the blue excitation source, the type of the second excitation light sources included in the second light source module is consisted of the red excitation source, is consisted of the green excitation source, or is consisted of the blue excitation source, the type of the third excitation light sources included in the third light source module is consisted of the red excitation source, is consisted of the green excitation source, or is consisted of the blue excitation source, and the type of the first excitation light sources included in the first light source module, the type of the second excitation light sources included in the second light source module, and the type of the third excitation light sources included in the third light source module are different.

16. The light source device according to claim 13, wherein a number of the at least one first light source assembly is plural, the first light source assemblies are sequentially arranged along the first central axis, a number of the at least one second light source assembly is plural, the second light source assemblies are sequentially arranged along the second central axis, a number of the at least one third light source assembly is plural, the third light source assemblies are sequentially arranged along the third central axis, the first light source module comprises a first part and a second part, the second light source module comprises a third part and a fourth part, the third light source module comprises a fifth part and a sixth part, and the light source device further comprises a second condenser lens, a first collimator lens, a third condenser lens, a second collimator lens, a fourth condenser lens, and a third collimator lens;

the first part comprises at least one of the first light source assemblies, the second part comprises at least one of the other of the first light source assemblies, the at least one first light source assembly in the first part forms a plurality of first sub-reflected lights, the at least one first light source assembly in the second part forms a plurality of second sub-reflected lights, the first reflected lights comprise the first sub-reflected lights and the second sub-reflected lights;

the second condenser lens is disposed between the first part and the second part, the second condenser lens is configured to converge the first sub-reflected lights into a second concentrating light, the first collimator lens is disposed on the first central axis, the first light source combinations of each of the at least one first light source assembly in the second part are arranged around the first collimator lens, and the first collimator lens is configured to collimate the second concentrating light into a first collimated light;

the third part comprises at least one of the second light source assemblies, the fourth part comprises at least one of the other of the second light source assemblies, the at least one second light source assembly in the third part forms a plurality of third sub-reflected lights, the at least one second light source assembly in the fourth part forms a plurality of fourth sub-reflected lights, the second reflected lights comprises the third sub-reflected lights and the fourth sub-reflected lights;

the third condenser lens is disposed between the third part and the fourth part, the third condenser lens is configured to converge the third sub-reflected lights into a third concentrating light, the second collimator lens is disposed on the second central axis, the second light source combinations of each of the second light source assembly in the fourth part are arranged around the second collimator lens, and the second collimator lens is configured to collimate the third concentrating light into a second collimated light;

the fifth part comprises at least one of the third light source assemblies, the sixth part comprises at least one of the other of the third light source assemblies, the at least one third light source assembly in the fifth part forms a plurality of fifth sub-reflected lights, the at least one third light source assembly in the sixth part forms a plurality of sixth sub-reflected lights, the third reflected lights comprise the fifth sub-reflected lights and the sixth sub-reflected lights;

the fourth condenser lens is disposed between the fifth part and the sixth part, the fourth condenser lens is configured to converge the fifth sub-reflected lights into a fourth concentrating light, the third collimator lens is disposed on the third central axis, the third light source combinations of each of the at least one third light source assembly in the sixth part are arranged around the third collimator lens, and the third collimator lens is configured to collimate the fourth concentrating light into a third collimated light; and the second beam splitter is configured to transmit the second sub-reflected lights, the fourth sub-reflected lights, the first collimated light, and the second collimated light, and reflect the sixth sub-reflected lights and the third collimated light, the first beam splitter is configured to transmit the second sub-reflected lights, the sixth sub-reflected lights, the first collimated light, and the third collimated light, and reflect the fourth sub-reflected lights and the second collimated light, the first condenser lens is configured to converge the second sub-reflected lights, the fourth sub-reflected lights, the sixth sub-reflected lights, the first collimated light, the second collimated light, and the third collimated light into the first concentrating light, so as to form the illumination beam.

17. A projection apparatus, comprising:
a light source device, configured to provide an illumination beam;
a light valve, disposed on a transmission path of the illumination beam to form an image beam; and
a projection lens, disposed on a transmission path of the image beam;
wherein the light source device comprises a light source module, the light source module comprises at least one light source assembly, each of the at least one light source assembly comprises a plurality of light source combinations, the light source combinations are arranged around a central axis, each of the light source combinations comprises an excitation light source and a reflecting article, the reflecting article is disposed between the excitation light source and the central axis for reflecting an excitation light of the excitation light source to form the illumination beam; and
a type of the excitation light sources included in the light source module is consisted of a red excitation source, a green excitation source, and a blue excitation source,
wherein a number of the at least one of the light source assembly is plural, the light source assemblies are sequentially arranged along the central axis,
wherein the reflecting articles of the light source combinations of the light source assemblies reflect the excitation lights and a plurality of reflected lights are formed, transmission directions of the reflected lights are parallel with the central axis, the light source device further comprises a first condenser lens, the first condenser lens is configured to converge the reflected lights into a first concentrating light to form the illumination beam,
wherein the light source module comprises a first part and a second part, the light source device further comprises a second condenser lens and a collimator lens, the first part comprises at least one of the light source assemblies, the second part comprises at least one of the other of the light source assemblies, the at least one light source assembly in the first part forms a plurality of first sub-reflected lights, the at least one other light source assembly in the second part forms a plurality of second sub-reflected lights, the reflected lights comprise the first sub-reflected lights and the second sub-reflected lights, the second condenser lens is disposed between the first part and the second part, the second condenser lens is configured to converge the first sub-reflected lights into a second concentrating light, and the collimator lens is disposed on the central axis, the light source combinations of each of the at least one of the light source assemblies in the second part are arranged around the collimator lens, the collimator lens is configured to collimate the second concentrating light into a collimated light, and the first condenser lens converges the second sub-reflected lights and the collimated light into the first concentrating light, so as to form the illumination beam.

18. The projection apparatus according to claim 17, wherein a number of the light source assembly is plural, the light source assemblies are sequentially arranged along the central axis, a distance is formed between the excitation light source and the reflecting article in each of the light source combinations of each of the light source assemblies, the distances of the light source assemblies increase along the central axis toward a transmission direction of the illumination beam, the reflecting articles of the light source combinations of the light source assemblies reflect the excitation lights and a plurality of reflected lights are formed, transmission directions of the reflected lights are parallel with the central axis, and the light source device further comprises a first condenser lens, the first condenser lens is configured to converge the reflected lights into a first concentrating light, so as to form the illumination beam.

19. The projection apparatus according to claim 18, wherein the light source device further comprises a light homogenizing component, the light homogenizing component is positioned between the light valve and the first condenser lens, the first concentrating light directly enters and passes through the light homogenizing component to form the illumination beam.

20. The projection apparatus according to claim 19, wherein the light source device further comprises a diffusing element, the diffusing element is positioned between the first condenser lens and the light homogenizing component, the first concentrating light directly enters and passes through the light homogenizing component to form the illumination beam after directly entering and passing through the diffusing element.

* * * * *